US008785001B2

(12) United States Patent
Vestweber et al.

(10) Patent No.: US 8,785,001 B2
(45) Date of Patent: *Jul. 22, 2014

(54) ORGANIC ELECTROLUMINESCENT DEVICES

(75) Inventors: Horst Vestweber, Gilserberg-Winterscheid (DE); Philipp Stoessel, Frankfurt Am Main (DE); Holger Heil, Darmstadt (DE)

(73) Assignee: Merck Patent GmbH (DE)

( * ) Notice: Subject to any disclaimer, the term of this patent is extended or adjusted under 35 U.S.C. 154(b) by 422 days.

This patent is subject to a terminal disclaimer.

(21) Appl. No.: 12/096,492

(22) PCT Filed: Nov. 17, 2006

(86) PCT No.: PCT/EP2006/011026
§ 371 (c)(1),
(2), (4) Date: Jun. 6, 2008

(87) PCT Pub. No.: WO2007/065547
PCT Pub. Date: Jun. 14, 2007

(65) Prior Publication Data
US 2008/0297037 A1 Dec. 4, 2008

(30) Foreign Application Priority Data
Dec. 8, 2005 (DE) .......................... 10 2005 058 557

(51) Int. Cl.
*H01L 51/54* (2006.01)
(52) U.S. Cl.
USPC ........... 428/690; 428/917; 313/504; 313/505; 313/506; 257/40; 257/E51.05; 257/E51.026; 257/E51.032; 564/26; 564/426; 564/434; 546/79; 546/81; 546/101
(58) Field of Classification Search
USPC ................. 428/690, 917; 313/504, 505, 506; 257/40, E51.05, E51.026, E51.032; 564/26, 426, 434; 546/79, 81, 101
See application file for complete search history.

(56) References Cited

U.S. PATENT DOCUMENTS

| 4,539,507 | A | 9/1985 | VanSlyke et al. |
| 5,151,629 | A | 9/1992 | VanSlyke |
| 5,840,217 | A | 11/1998 | Lupo et al. |
| 5,998,046 | A | 12/1999 | Tada et al. |
| 6,066,357 | A * | 5/2000 | Tang et al. ...................... 427/66 |
| 6,274,065 | B1 * | 8/2001 | Deno et al. ............... 252/301.16 |
| 6,458,909 | B1 | 10/2002 | Spreitzer et al. |
| 2005/0233165 | A1 | 10/2005 | Ido et al. |
| 2006/0043858 | A1 | 3/2006 | Ikeda et al. |
| 2006/0134456 | A1 | 6/2006 | Ikeda et al. |
| 2006/0175958 | A1 | 8/2006 | Gerhard et al. |

FOREIGN PATENT DOCUMENTS

| CN | 1322232 | | 11/2001 |
| CN | 1322232 | | 1/2002 |
| CN | 1322232 | A | 1/2002 |
| EP | 0676461 | A2 | 10/1995 |
| EP | 0866110 | A1 | 9/1998 |
| EP | 1074601 | * | 8/2000 |
| EP | 1167488 | * | 9/2000 |
| EP | 1167488 | A1 | 1/2002 |
| EP | 1533289 | A1 | 5/2005 |
| EP | 1533290 | A1 | 5/2005 |
| EP | 1553154 | A1 | 7/2005 |
| JP | 04-184892 | | 7/1992 |
| WO | WO-98/27136 | A1 | 6/1998 |
| WO | WO-2004/013073 | A1 | 2/2004 |
| WO | WO-2004/016575 | A1 | 2/2004 |
| WO | WO-2004/018587 | A1 | 3/2004 |
| WO | WO-2005/011013 | A1 | 2/2005 |
| WO | WO-2006/000389 | A1 | 1/2006 |
| WO | WO-2006/048268 | A1 | 5/2006 |

OTHER PUBLICATIONS

Greiner et al., Synthesis, Proterties, and Guest-Host Systems of Triphenylamine-Based Oligo(arylenevinylene)s: Advanced Materials of LED Applications, 1996, Macromolecules, vol. 29, pp. 7705-7708.*
Chinese Office Action dated Dec. 22, 2010 for Application No. 200680046146.3.
Wang et al., "Synthesis of New Multibranch Chromophores with Strong Light-Emitting in Solution and in PMMA Film", Chinese Chemical Letters, vol. 14, No. 11, pp. 1135-1138, 2003.
The State Intellectual Property Office of the People's Republic of China Notification of the First Office Action for Application No. 200680046146.3 dated Dec. 22, 2010.

* cited by examiner

*Primary Examiner* — Gregory Clark
(74) *Attorney, Agent, or Firm* — Drinker Biddle & Reath LLP

(57) ABSTRACT

The present invention relates to mixtures of organic materials, to the use of these mixtures in organic electroluminescent devices, and to organic electroluminescent devices comprising these mixtures.

23 Claims, No Drawings

ORGANIC ELECTROLUMINESCENT DEVICES

RELATED APPLICATIONS

This application is a national stage application (under 35 U.S.C. §371) of PCT/EP2006/011026, filed Nov. 17, 2006, which claims benefit of German application 10 2005 058 557.4, filed Dec. 8, 2005.

The present invention relates to mixtures of organic materials, to the use of these mixtures in organic electroluminescent devices, and to organic electroluminescent devices comprising these mixtures.

The general structure of organic electroluminescent devices which are capable of the emission of light in the visible spectral region and comprise semiconducting organic compounds is described, for example, in U.S. Pat. No. 4,539,507, U.S. Pat. No. 5,151,629, EP 0676461 and WO 98/27136.

However, these devices still exhibit considerable problems which require urgent improvement for use in high-quality full-colour displays:

1. The operating lifetime is still short, in particular in the case of blue emission, meaning that it has to date only been possible to achieve simple applications commercially.
2. The systems having the best lifetimes to date exhibit pale-blue or blue-green, but not dark-blue emission and are therefore unsuitable for high-quality applications.
3. Many blue-emitting emitters which comprise both aromatic amines and also double-bond systems are thermally unstable and decompose on sublimation or on vapour deposition. The use of these systems is thus impossible or only possible with large losses and high technical complexity.
4. In particular in the case of the combination of good lifetime and dark-blue emission, there is still a considerable need for improvement.

JP 04-184892 describes distilbenamines, tristilbenamines and further stilbene derivatives as emitting compounds for OLEDs. These compounds are employed as pure substance in the emitting layer. The emission colour is not described. Likewise, neither the efficiency nor the lifetime of the OLEDs is mentioned. These stilbenamines exhibit blue-green or green emission in the device structure proposed and are not suitable for the generation of dark-blue emission.

EP 1167488 proposes the combination of monostyrylamines, distyrylamines, tristyrylamines or tetrastyrylamines together with certain dianthracene derivatives or with anthracene derivatives which are substituted by condensed aromatic ring systems or by aryl groups having 12 or more carbon atoms. This is only carried out on linear styrylamines. Likewise, the further developments of the host material have only been optimised for linear styrylamines (for example WO 04/013073, WO 04/016575, WO 04/018587). Good lifetimes are mentioned in the case of blue emission; no colour coordinates are indicated. Only green-blue instead of dark-blue emission is obtained here. It is not apparent how blue, in particular dark-blue, emission can be generated using these material combinations. Furthermore, the emitting compounds used in the prior art are thermally unstable and cannot be evaporated without decomposition, which requires high technical complexity for the vapour deposition and thus represents a significant industrial disadvantage.

The object of the present invention was therefore to offer improvements for this purpose, in particular systems having improved thermal stability and dark-blue emission colour at the same time as a comparably good or improved lifetime.

Surprisingly, it has been found that organic electroluminescent devices which comprise a combination of tristilbenamines and certain anthracene derivatives mentioned below in the emitting layer have significant improvements over the prior art. This material combination can be used to obtain comparable or improved lifetimes at the same time as a significantly improved, dark-blue emission colour. In addition, the emission materials, in contrast to the materials used in accordance with the prior art, usually in combination with anthracene derivatives, can be sublimed and vapour-deposited without significant decomposition and are therefore significantly easier to handle than emitters used in accordance with the prior art. This result is particularly surprising since it is known from the above-mentioned prior art that the emitters alone exhibit green or green-blue emission and that linear styrylamines likewise exhibit only green-blue emission in anthracene host materials. The fact that tristilbenamines exhibit dark-blue emission in anthracene host materials is therefore an unexpected and unforeseeable result. The present invention therefore relates to these material mixtures and to the use thereof in OLEDs.

The invention relates to organic electroluminescent devices comprising anode, cathode and at least one organic layer, characterised in that the organic layer comprises the following components:

a) at least one compound of the formula (1)

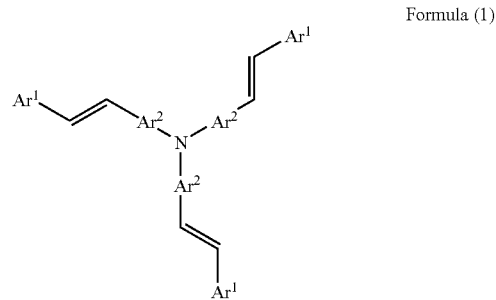

Formula (1)

where the following applies to the symbols used:

$Ar^1$ is, identically or differently on each occurrence, an aromatic or heteroaromatic ring system having 5 to 30 aromatic ring atoms, which may be substituted by one or more radicals $R^1$;

$Ar^2$ is, identically or differently on each occurrence, a divalent arylene or heteroarylene group having 5 to 20 aromatic ring atoms, which may be substituted by one or more radicals $R^1$;

$R^1$ is, identically or differently on each occurrence, H, F, Cl, Br, I, CN, $Si(R^3)_3$, $N(R^3)_2$, $B(OR^3)_2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^3$, where one or more non-adjacent $CH_2$ groups may be replaced by $-R^3C=CR^3-$, $-C\equiv C-$, $Si(R^3)_2$, $Ge(R^3)_2$, $Sn(R^3)_2$, $C=O$, $C=S$, $C=Se$, $C=NR^3$, $-O-$, $-S-$, $-N(R^3)-$ or $-CONR^3-$ and where one or more H atoms may be replaced by F, Cl, Br, I, CN or $NO_2$, or an aryl or heteroaryl group having 5 to 30 aromatic ring atoms, which may be substituted by one or more radicals $R^3$, or an aryloxy or heteroaryloxy group having 5 to 24 aromatic ring atoms, which may be substituted by one or more radicals $R^3$, or a combination of two, three, four or five of these systems;

two or more substituents R¹ here may also form a mono- or polycyclic, aliphatic or aromatic ring system with one another;

R³ is on each occurrence, identically or differently, H or an aliphatic or aromatic hydrocarbon radical having 1 to 20 C atoms; two or more radicals R³ here may also form a mono- or polycyclic, aliphatic or aromatic ring system with one another;

and b) at least one compound of the formula (2) or formula (3)

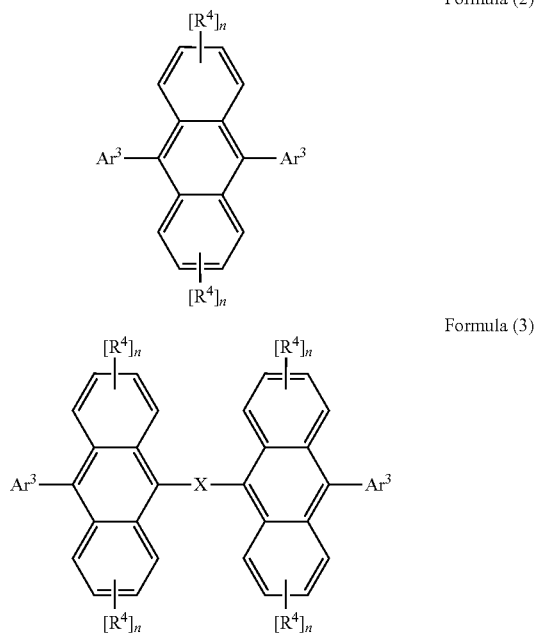

Formula (2)

Formula (3)

where the following applies to the symbols used:

Ar³ is, identically or differently on each occurrence, an aromatic or heteroaromatic ring system having 5 to 30 aromatic ring atoms, which may be substituted by one or more radicals R²;

X is on each occurrence, identically or differently, a divalent group containing 1 to 40 C atoms or —O—, —S—, —NH— or a single bond;

R², R⁴ are, identically or differently on each occurrence, H, F, Cl, Br, I, CN, N(R³)₂, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R³, where one or more non-adjacent CH₂ groups may be replaced by —R³C=CR³—, —C≡C—, Si(R³)₂, Ge(R³)₂, Sn(R³)₂, C=O, C=S, C=Se, C=NR³, —O—, —S—, —N(R³)— or —CONR³— and where one or more H atoms may be replaced by F, Cl, Br, I, CN or NO₂, or an aryl or heteroaryl group having 5 to 30 aromatic ring atoms, which may be substituted by one or more radicals R³, or an aryloxy or heteroaryloxy group having 5 to 24 aromatic ring atoms, which may be substituted by one or more radicals R³, or a combination of two, three, four or five of these systems; two or more adjacent substituents R⁴ here may also form a mono- or polycyclic, aliphatic ring system with one another;

R³ has the same meaning as described above;

n is, identically or differently on each occurrence, 0, 1, 2, 3 or 4.

The organic layer is preferably a layer which is capable of the emission of light, in particular an emitting layer.

For the purposes of this invention, a cyclic alkyl group is taken to mean both monocyclic and also bi- and polycyclic alkyl groups.

For the purposes of this invention, an aryl group or heteroaryl group is taken to mean an aromatic group or heteroaromatic group having a common aromatic π-electron system. For the purposes of this invention, this can be a simple homocycle or heterocycle, for example benzene pyridine, thiophene, etc., or it can be a condensed aromatic ring system, in which at least two aromatic or heteroaromatic rings, for example benzene rings, are "fused" to one another, i.e. are condensed onto one another by anellation, i.e. have at least one common edge and thus also have a common aromatic n-electron system. These aryl or heteroaryl groups may be substituted or unsubstituted; any substituents present may likewise form further ring systems. Thus, for example, systems such as naphthalene, anthracene, phenanthrene, pyrene, etc., are regarded as aryl groups and quinoline, acridine, benzothiophene, carbazole, etc., are regarded as heteroaryl groups for the purposes of this invention, while, for example, biphenyl, fluorene, spirobifluorene, etc., do not represent aryl groups since they involve separate aromatic electron systems.

For the purposes of this invention, an aromatic ring system contains 6 to 30 C atoms in the ring system. For the purposes of this invention, a heteroaromatic ring system contains 2 to 30 C atoms and at least one heteroatom in the ring system, with the proviso that the sum of C atoms and hetero atoms is at least 5. The hetero atoms are preferably selected from N, O and/or S. For the purposes of this invention, an aromatic or heteroaromatic ring system is intended to be taken to mean a system which does not necessarily contain only aryl or heteroaryl groups, but instead in which a plurality of aryl or heteroaryl groups may also be interrupted by a short non-aromatic unit (less than 10% of the atoms other than H, preferably less than 5% of the atoms other than H), such as, for example, an sp³-hybridised C, N or O atom. Thus, for example, systems such as 9,9'-spirobifluorene, 9,9-diarylfluorene, triarylamine, diaryl ethers, etc., are also intended to be taken to mean aromatic ring systems for the purposes of this invention. Part of the aromatic or heteroaromatic ring system here may also be a condensed group.

For the purposes of the present invention, a C₁- to C₄₀-alkyl group, in which, in addition, individual H atoms or CH₂ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclo pentenyl, hexenyl, cyclohexenyl, heptenyl, cycloheptenyl, octenyl, cyclooctenyl, ethynyl, propynyl, butynyl, pentynyl, hexynyl or octynyl. A C₁- to C₄₀-alkoxy group is particularly preferably taken to mean methoxy, ethoxy, n-propoxy, i-propoxy, n-butoxy, i-butoxy, s-butoxy, t-butoxy or 2-methylbutoxy. An aromatic or heteroaromatic ring system having 1 to 30 aromatic ring atoms, which may also in each case be substituted by the above-mentioned radicals R¹ or R² and which may be linked to the aromatic or heteroaromatic ring system via any desired positions, is taken to mean, in particular, groups derived from benzene, naphthalene, anthracene, phenanthrene, pyrene, chrysene, perylene, fluoranthene, tetracene, pentacene, benzopyrene, biphenyl, biphenylene, terphenyl, terphenylene, fluorene, spirobifluorene, truxene, isotruxene, dihydrophenanthrene, dihydropyrene, tetrahydropyrene, cis- or trans-indenofluorene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preferred embodiments of compounds of the formula (1) are described below.

Preference is given to compounds of the formula (1) in which the symbol $Ar^2$, identically or differently on each occurrence, stands for a divalent arylene or heteroarylene group, in particular an arylene group, having 6 to 14 C atoms, which may be substituted by one or more radicals $R^1$, very particularly preferably for a phenylene or naphthylene group, each of which may be substituted by one or more radicals $R^1$, in particular for a phenylene group, which may be substituted by one or more radicals $R^1$. Preference is thus given to compounds of the following formula (1a), where the phenylene groups may also be substituted by one or more radicals $R^1$; the phenylene groups are particularly preferably unsubstituted:

Formula (1a)

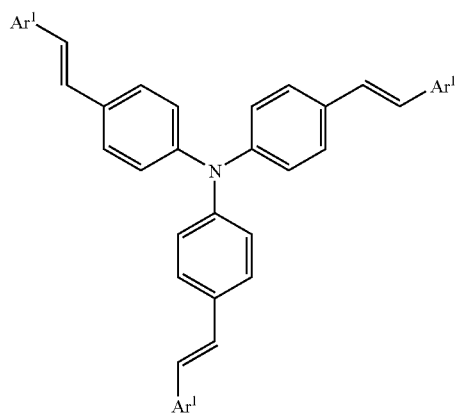

Preference is given to compounds of the formula (1) or formula (1a) in which the symbol $Ar^1$, identically or differently on each occurrence, stands for an aryl or heteroaryl group, in particular an aryl group, having 6 to 14 C atoms, which may be substituted by one or more radicals $R^1$, very particularly preferably for a phenyl, 1-naphthyl or 2-naphthyl group, each of which may be substituted by one or more radicals $R^1$, in particular for a phenyl group, which may be substituted by one or more radicals $R^1$. The radicals $R^1$ on the group $Ar^1$ are preferably bonded in the para-position to the double bond.

Preferred radicals $R^1$ are selected from the group consisting of H, F, $Si(R^3)_3$, $B(OR^3)_2$, straight-chain alkyl or alkoxy groups having 1 to 6 C atoms or branched or cyclic alkyl or alkoxy groups having 3 to 10 C atoms, where in each case one or more $CH_2$ groups may be replaced by —$R^3C=CR^3$—, $Si(R^3)_2$, —O—, —S— or —$N(R^3)$— and where in each case one or more H atoms may be replaced by F, or monovalent aryl or heteroaryl groups having 5 to 14 aromatic ring atoms, or a combination of two or three of these systems. Particularly preferred radicals $R^1$ are selected from the group consisting of H, F, $Si(R^3)_3$, $B(OR^3)_2$, straight-chain alkyl groups having 1 to 4 C atoms, branched alkyl groups having 3 to 5 C atoms or cyclic alkyl groups having 5 to 10 C atoms, where in each case one or more H atoms may be replaced by F, or monovalent aryl or heteroaryl groups having 6 to 10 aromatic ring atoms, or a combination of two of these systems. Very particularly preferred radicals $R^1$ are selected from H, F, methyl, $CF_3$, ethyl, isopropyl, tert-butyl, adamantyl, methoxy, trifluoromethoxy, phenyl, ortho-tolyl, meta-tolyl, para-tolyl, parafluorophenyl, $Si(Me)_3$, $Si(Me)_2(t-Bu)$, $SiMe(t-Bu)_2$, $Si(i-Pr)_3$, boronic acid glycol ester and boronic acid pinacol ester.

Very particular preference is given to compounds of the formula (1) or formula (1a) in which the symbols $Ar^1$ stand for phenyl groups which are substituted in the para-position by the above-mentioned radicals $R^1$.

Preference is furthermore given to compounds of the formula (1) or formula (1a) in which the symbols $Ar^1$ are all selected identically. Particular preference is given to compounds of the formula (1) or formula (1a) in which the groups $Ar^1$ are all selected identically and are all substituted by identical substituents $R^1$ in identical positions, i.e. compounds which have a threefold axis of symmetry.

Examples of preferred compounds of the formula (1) are compounds (S1) to (S87) depicted below.
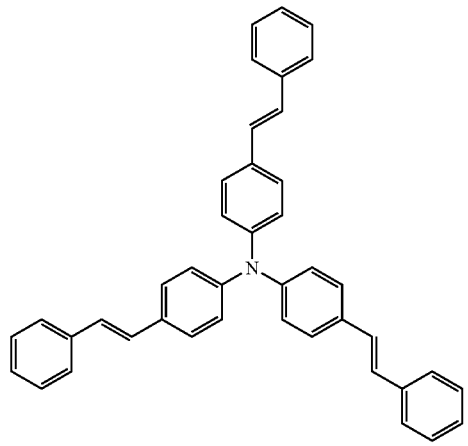
(S1)
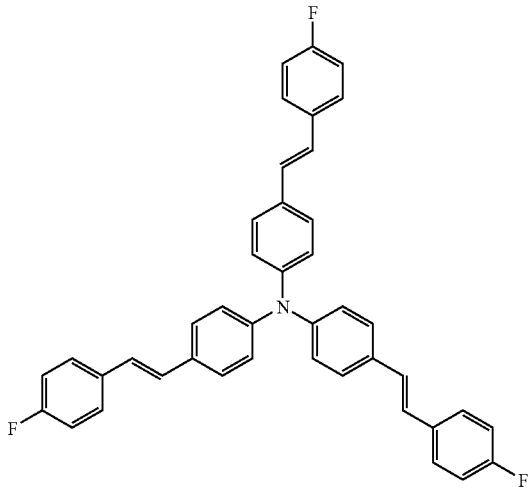
(S2)
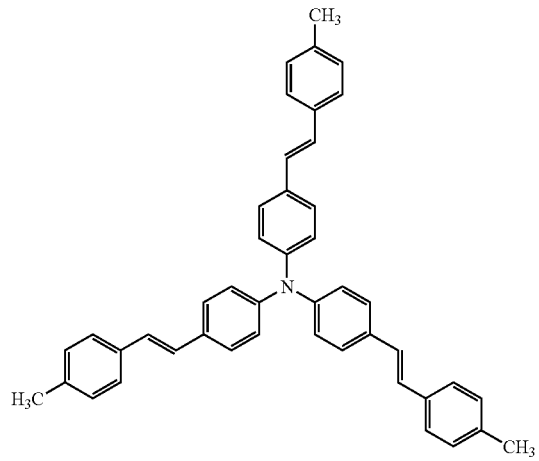
(S3)
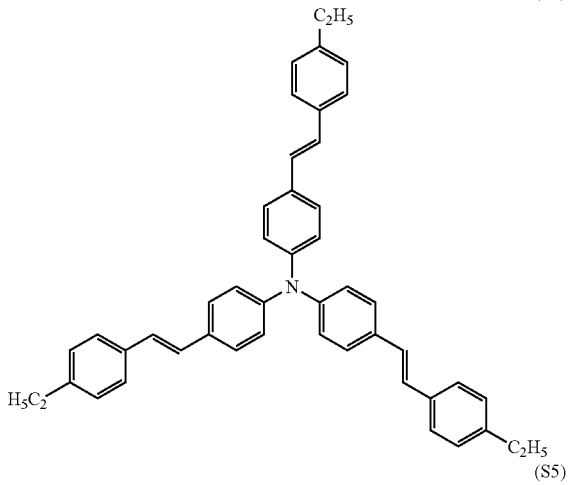
(S4)
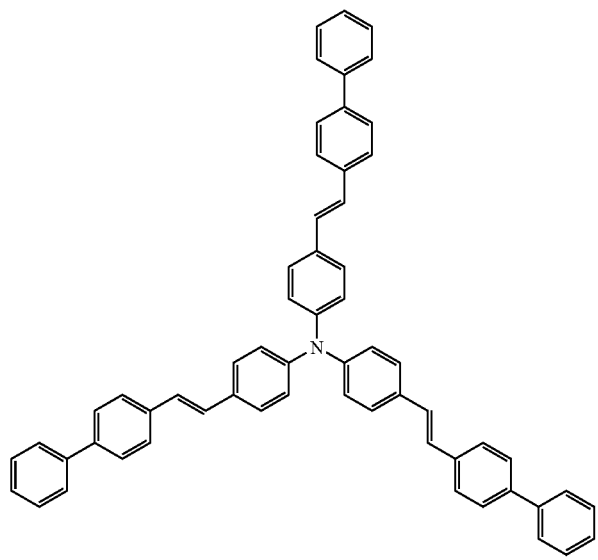
(S5)

-continued
(S6)
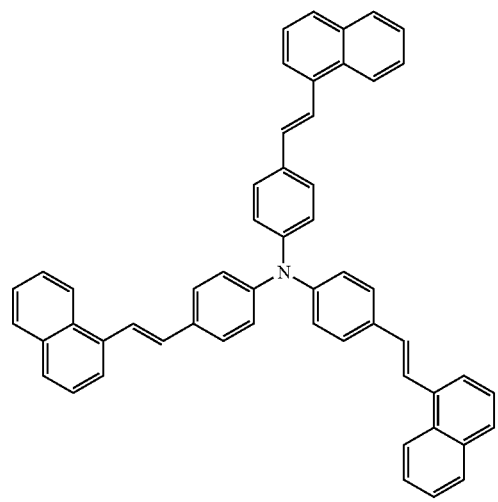
(S7)
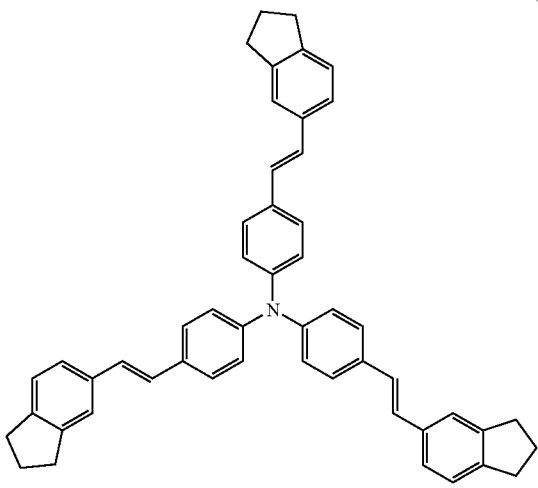
(S8)
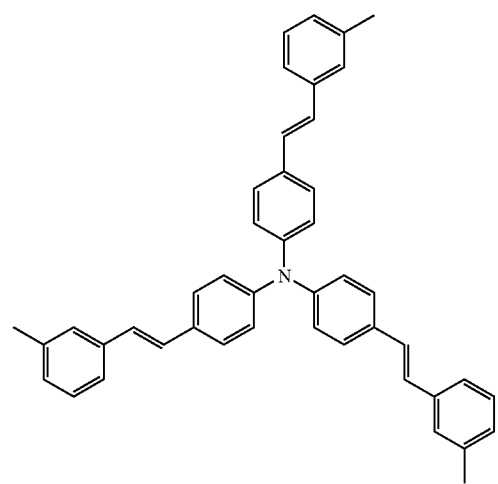
(S9)
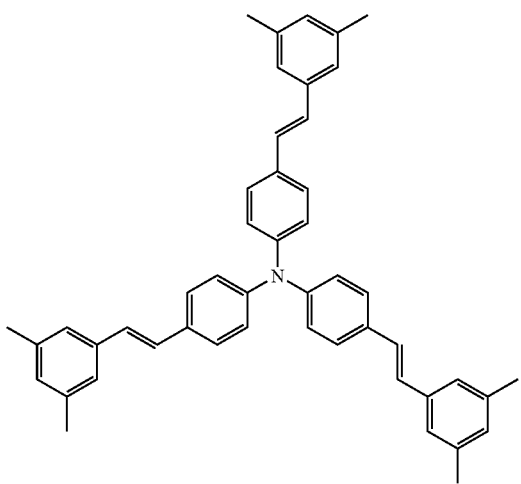
(S10)
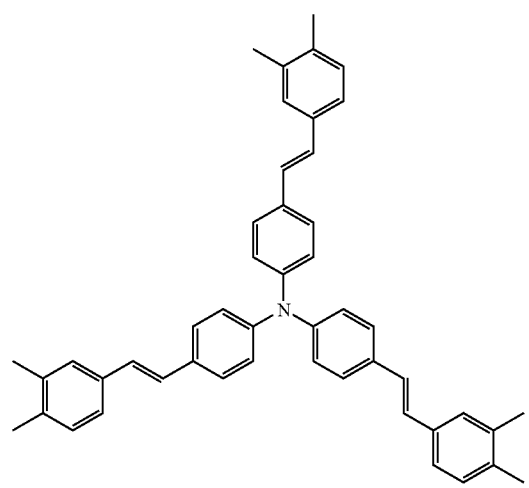
(S11)
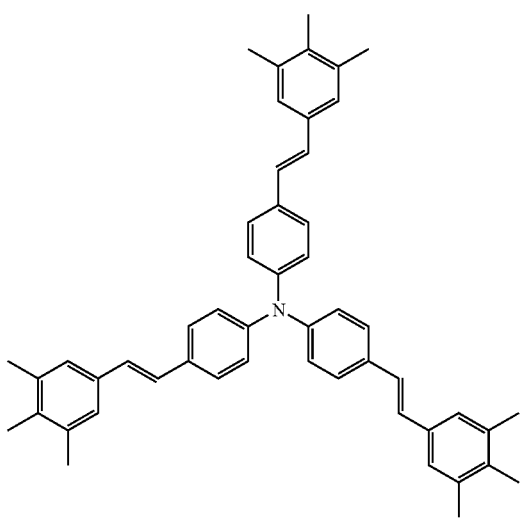

-continued
(S12)
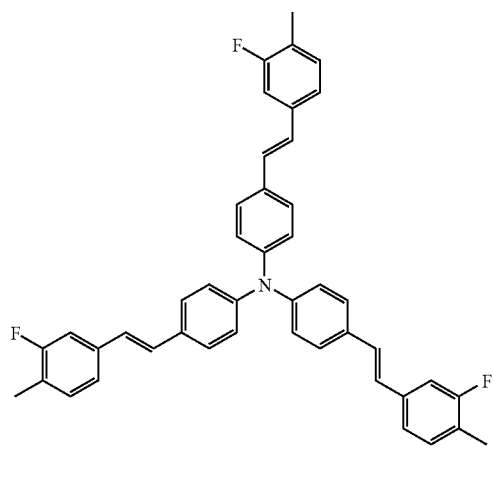
(S13)
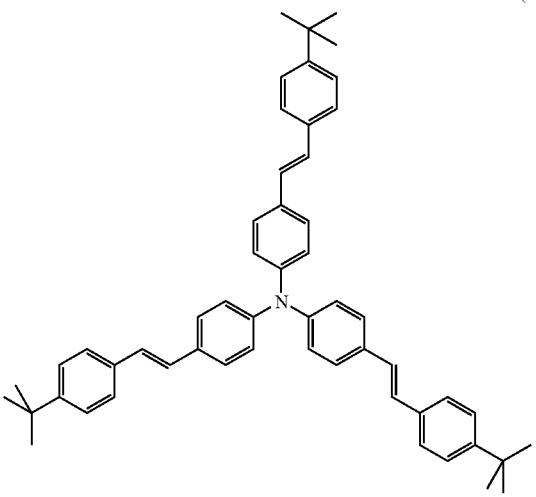
(S14)
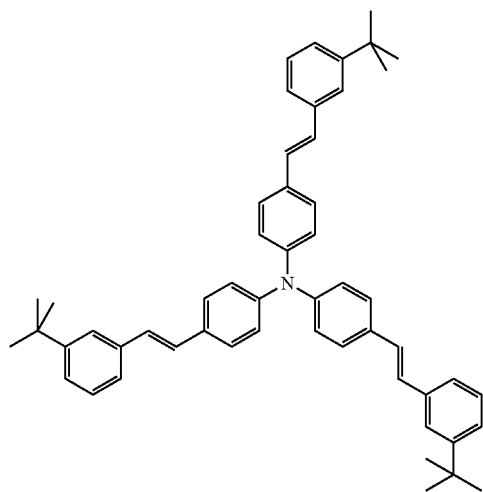
(S15)
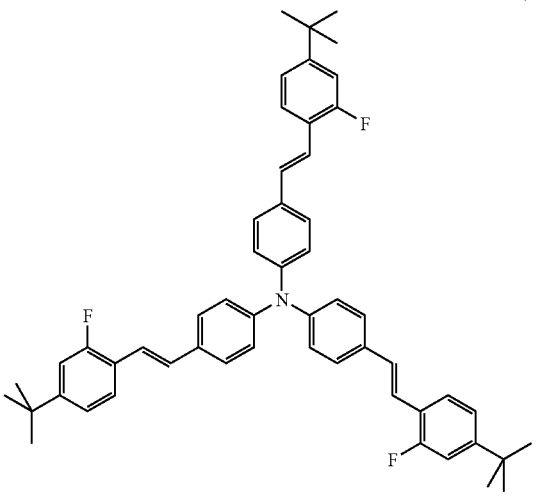
(S16)
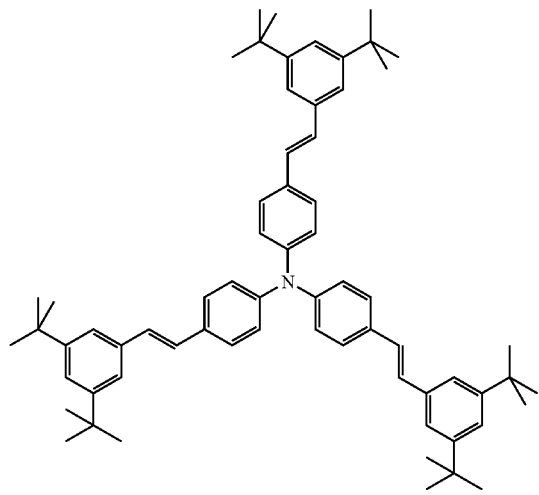
(S17)
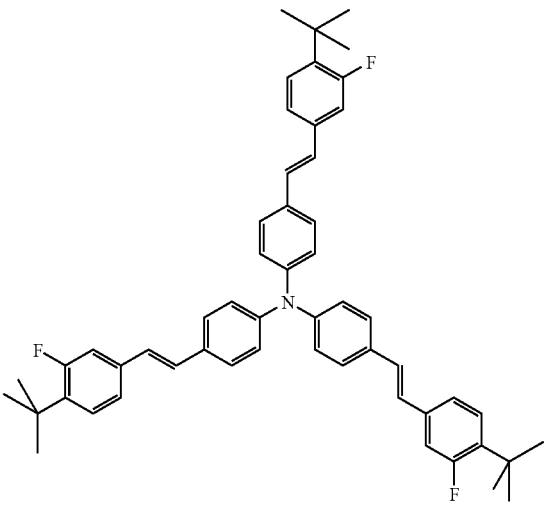

-continued
(S18)
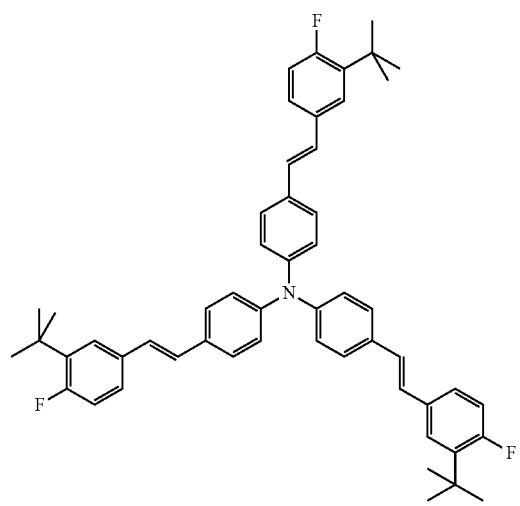
(S19)
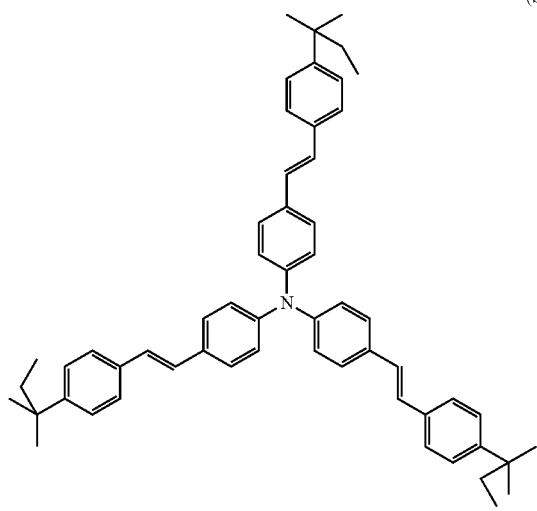
(S20)
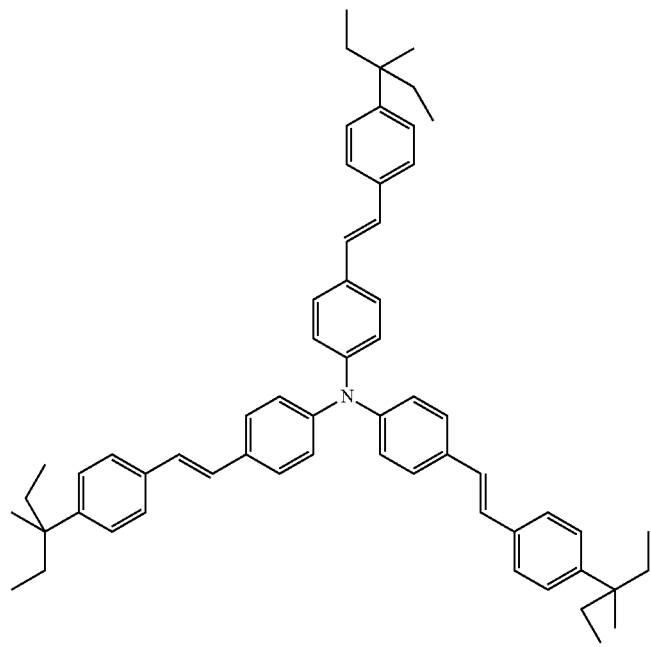

-continued
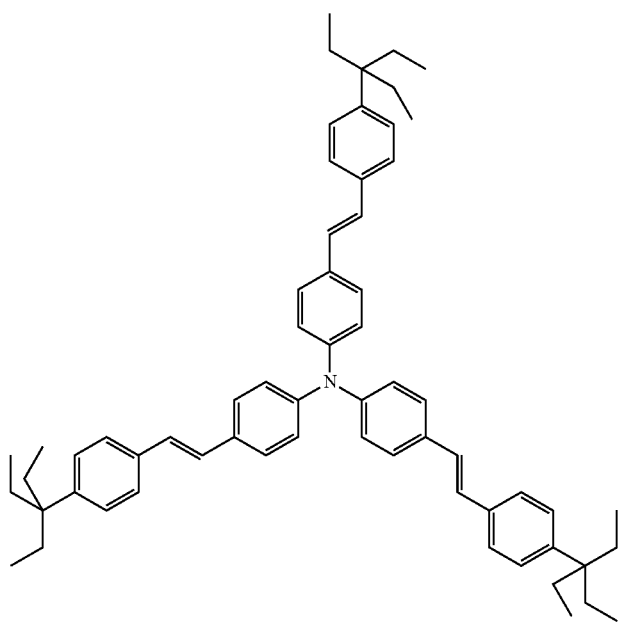
(S21)
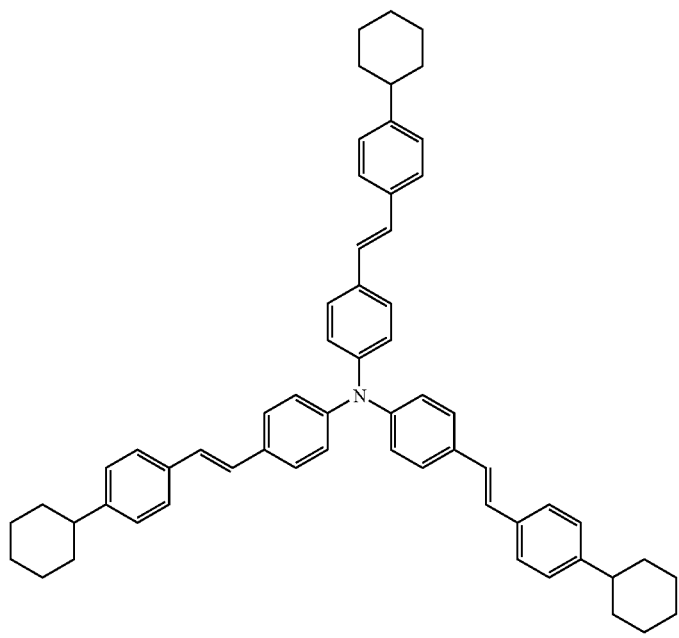
(S22)

-continued
(S23)
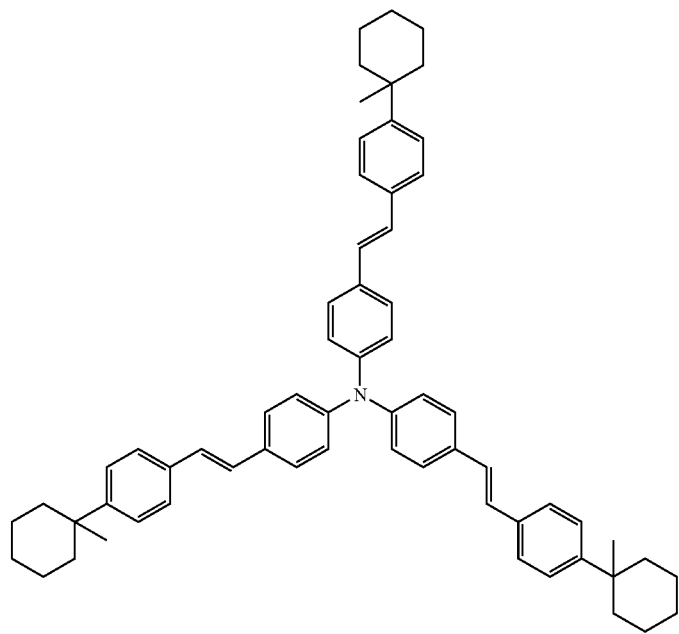
(S24)
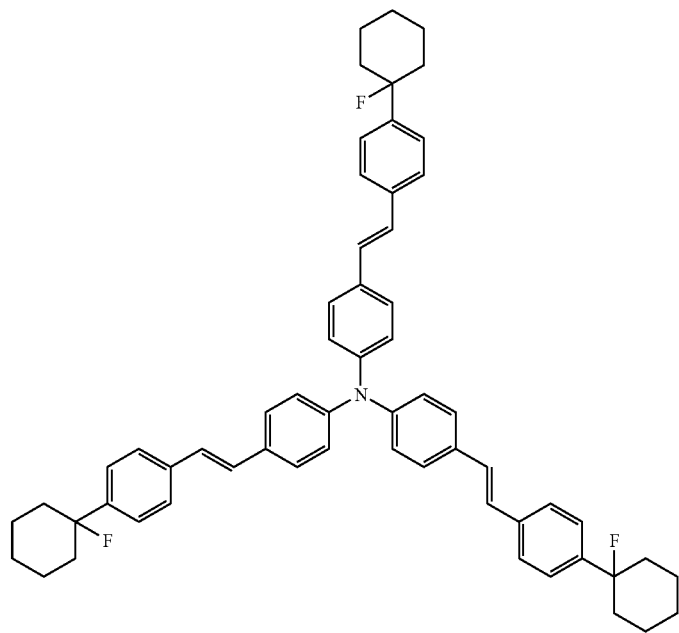

(S25)
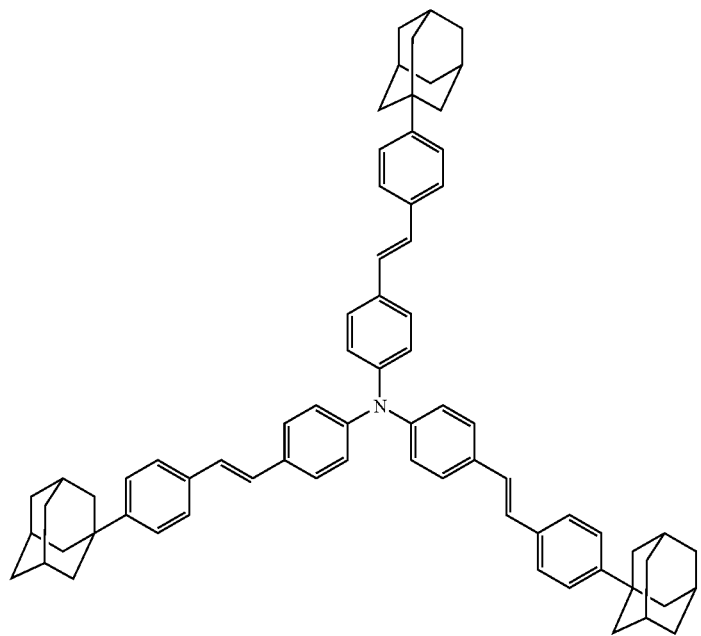
(S26)
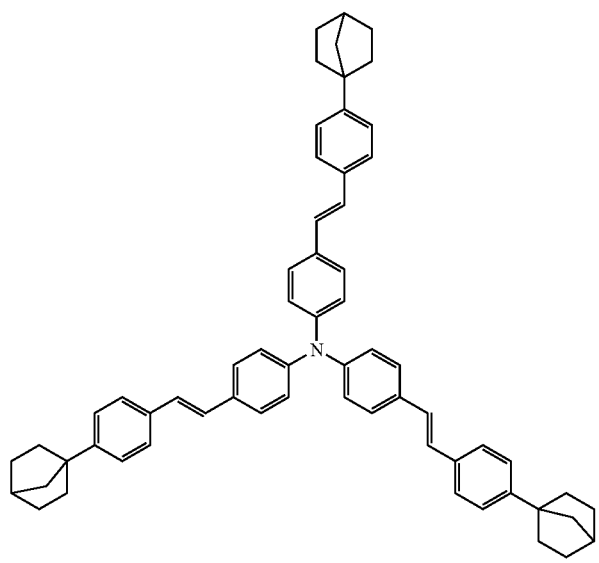

-continued
(S27)
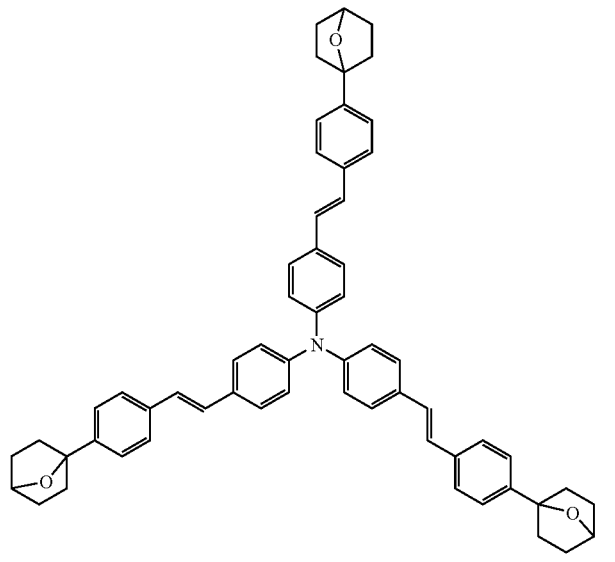
(S28) (S29)
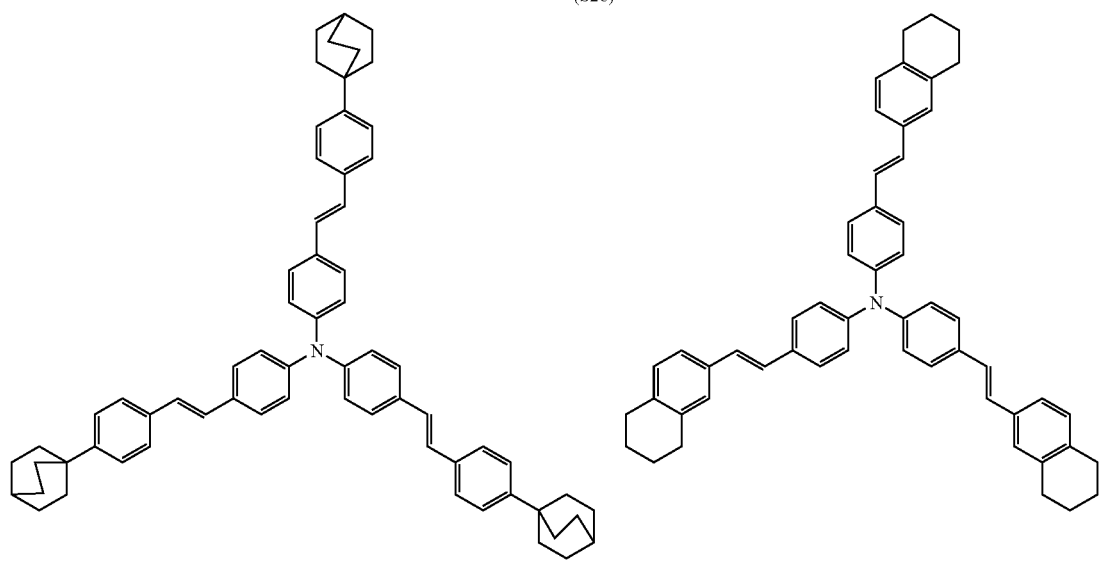
(S30) (S31)
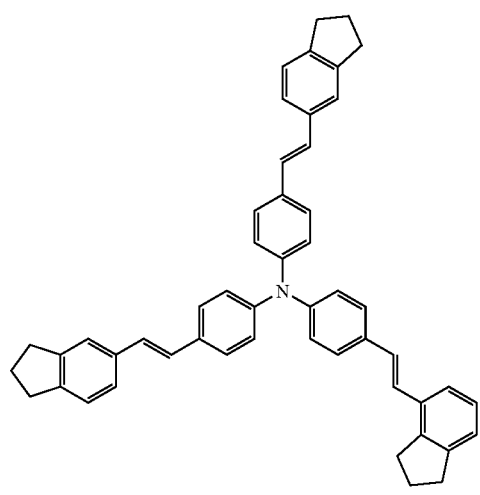
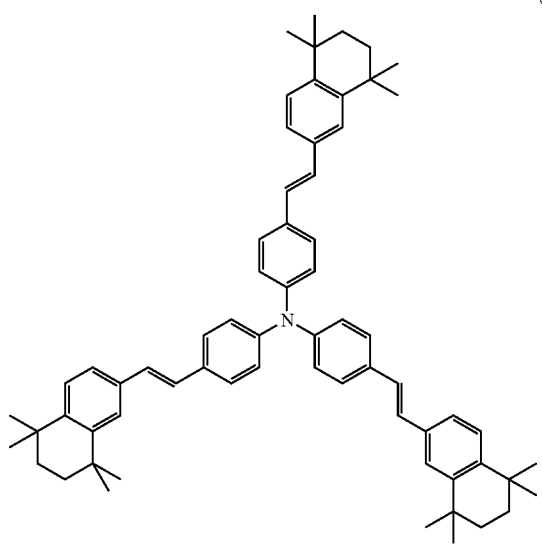

-continued
(S32)
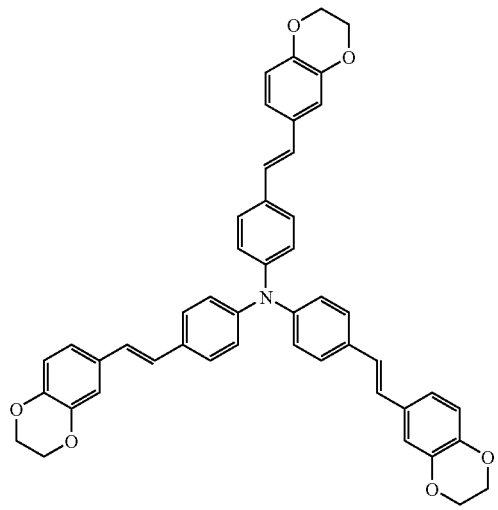
(S33)
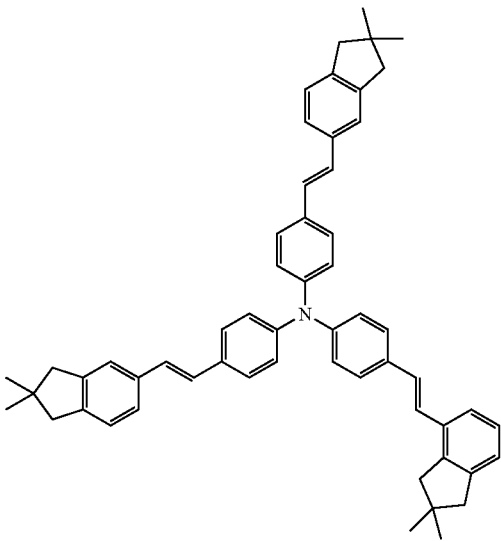
(S34)
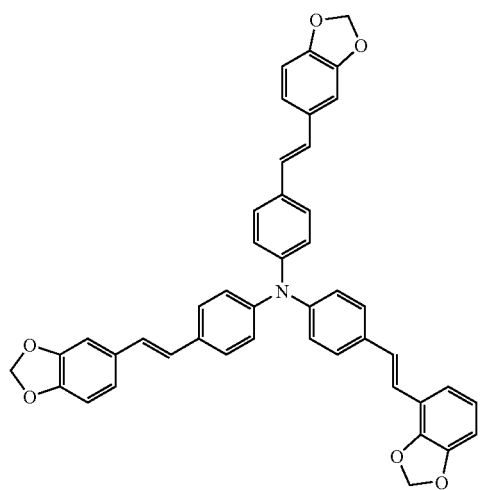
(S35)
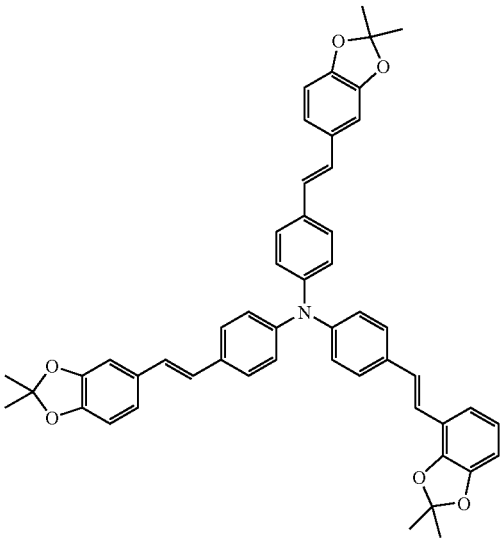
(S36)
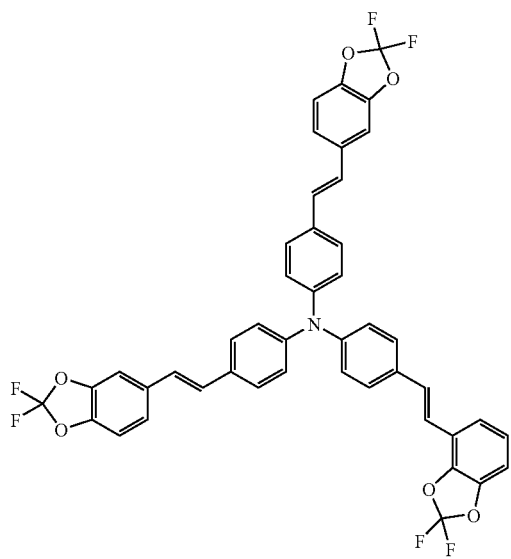
(S37)
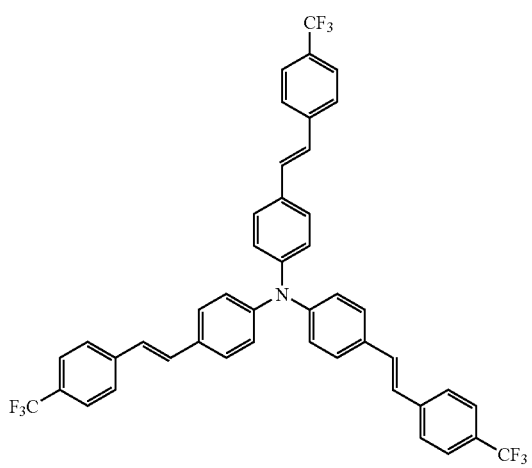

-continued
(S38)
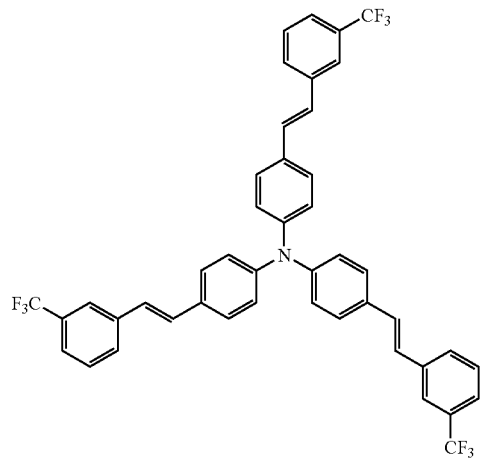
(S39)
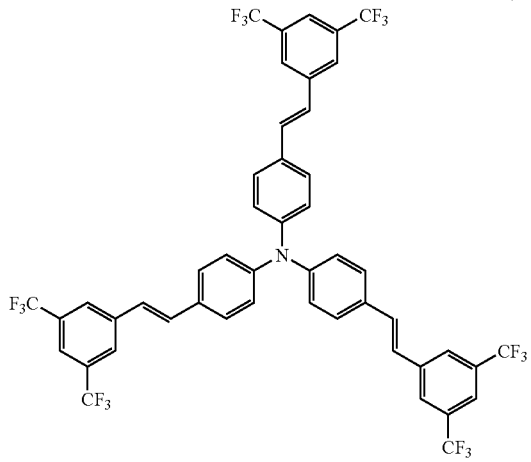
(S40)
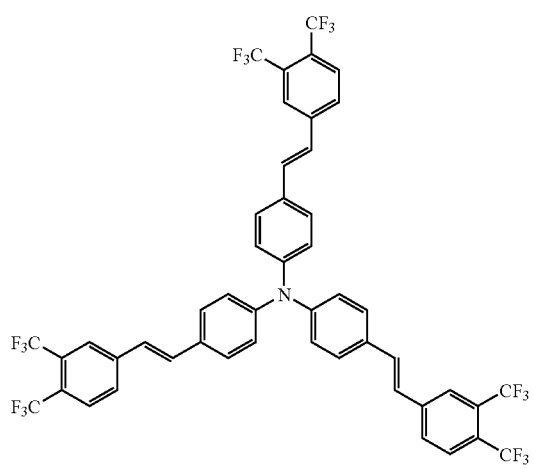
(S41)
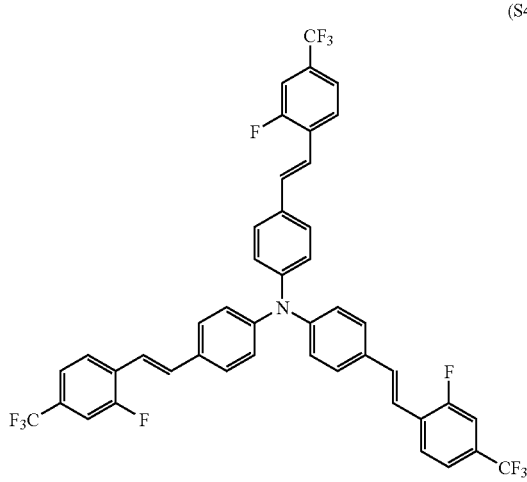
(S42)
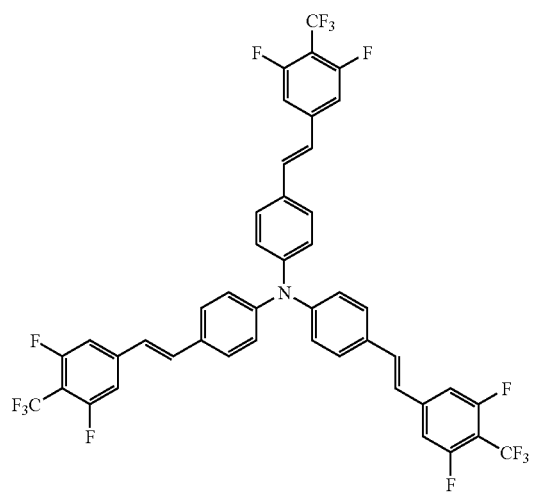
(S43)
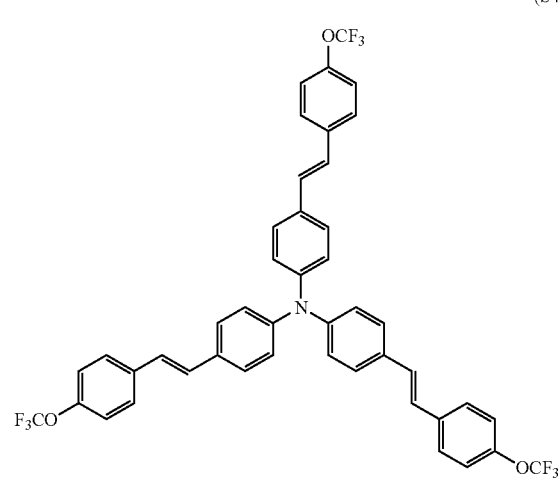

-continued
(S44)
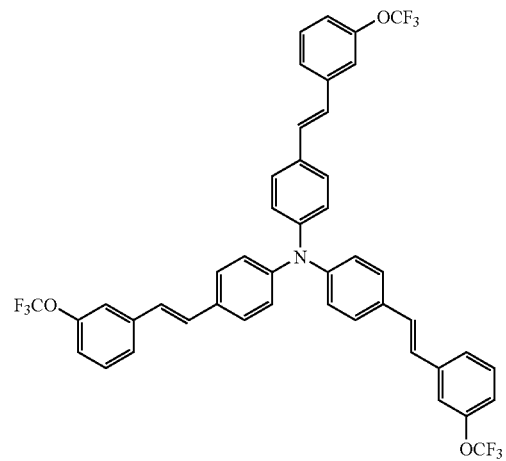
(S45)
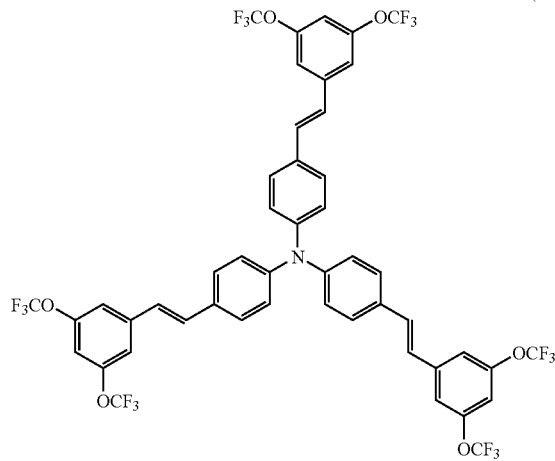
(S46)
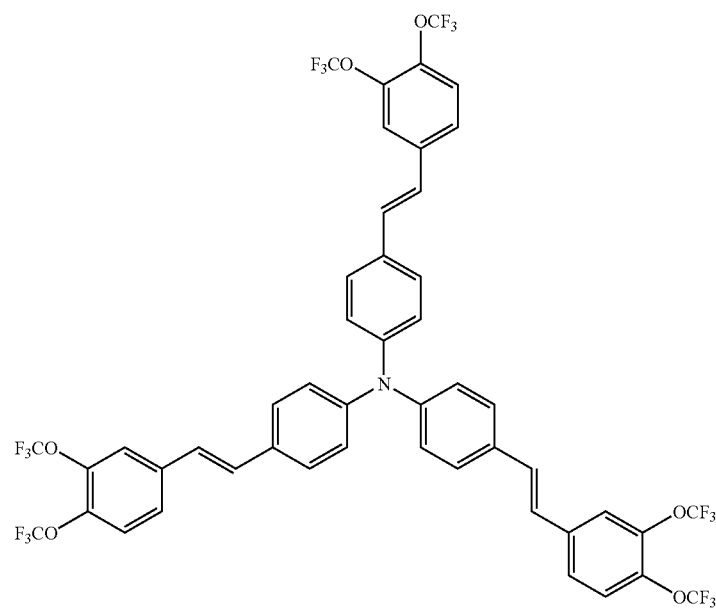

-continued
(S47)
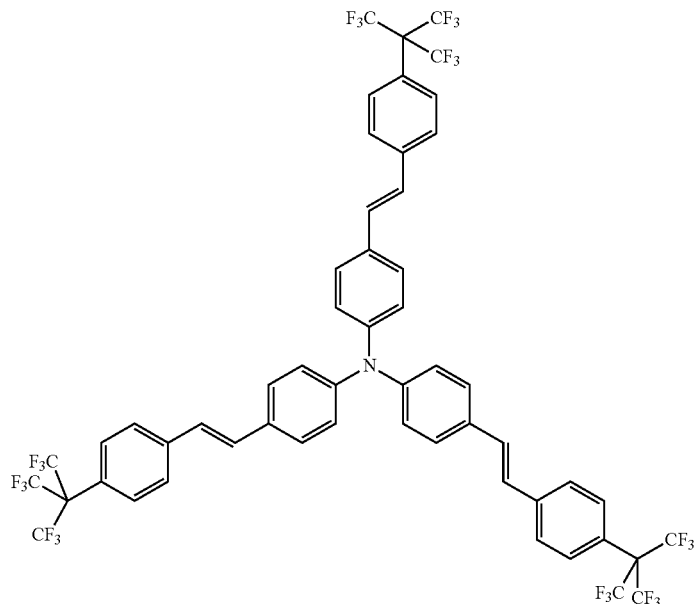
(S48)
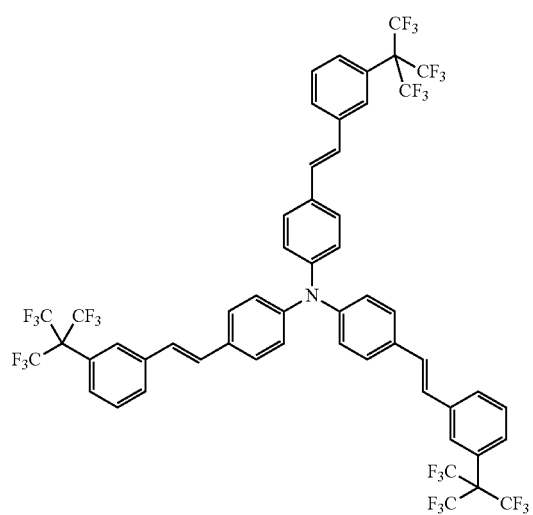
(S49)
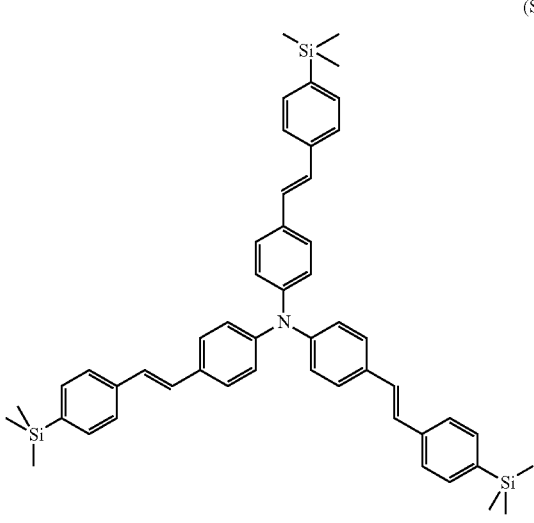
(S50)
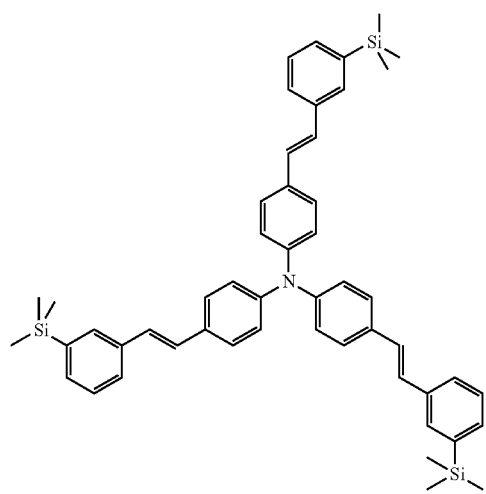
(S51)
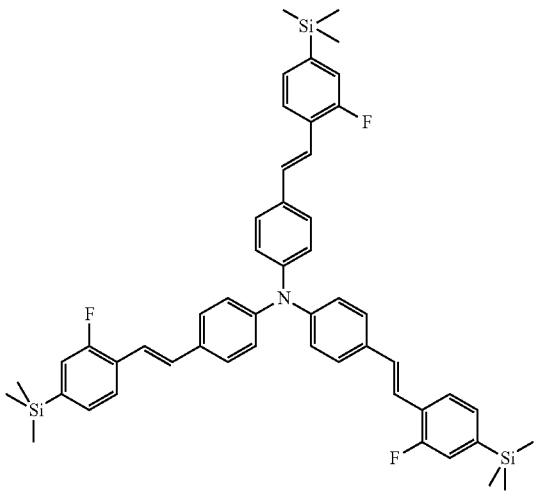

-continued
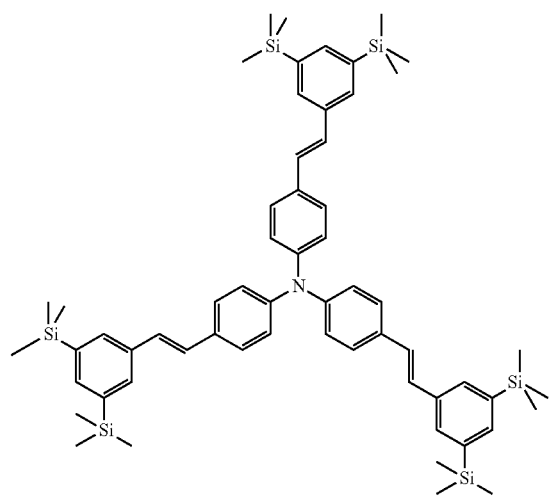
(S52)
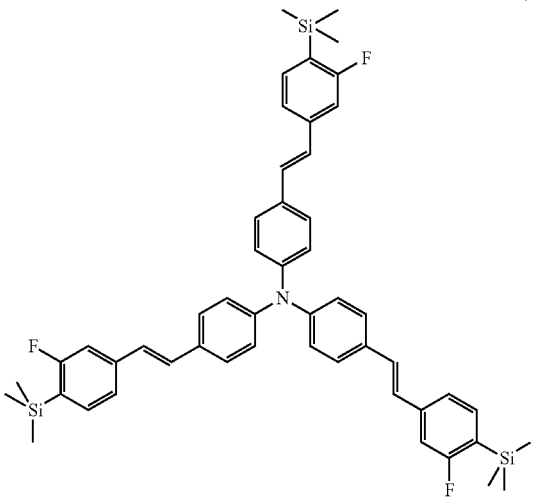
(S53)
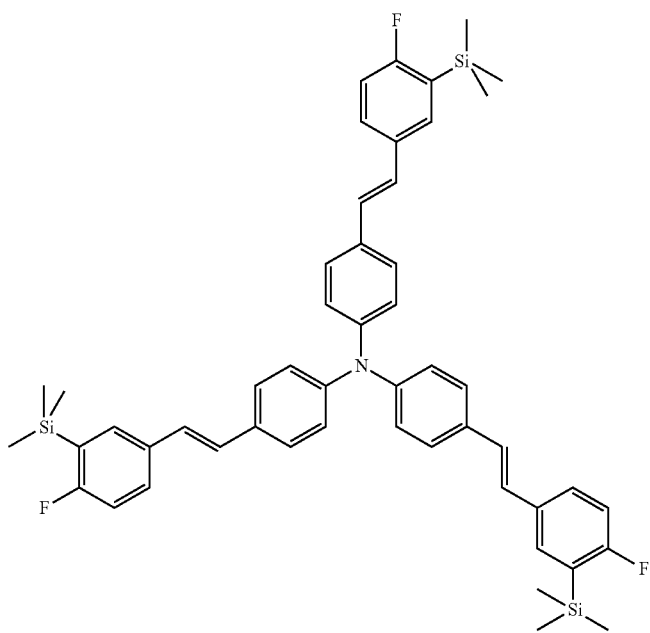
(S54)

-continued
(S55)
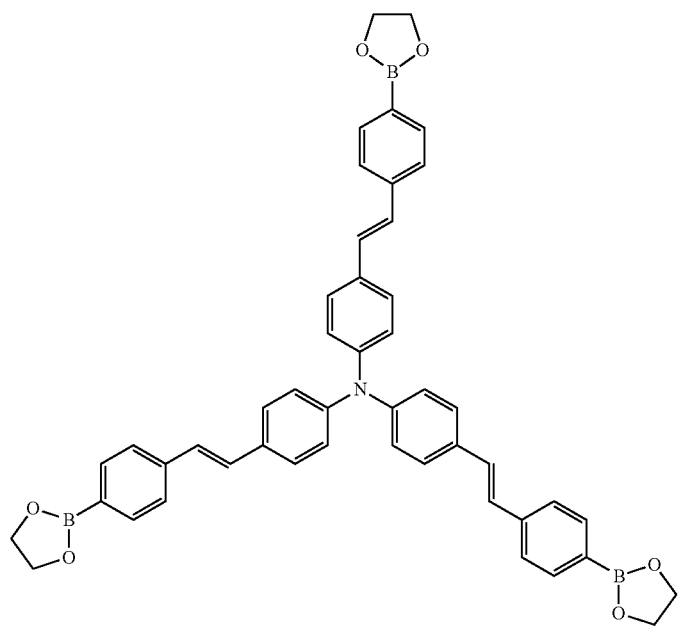
(S56)
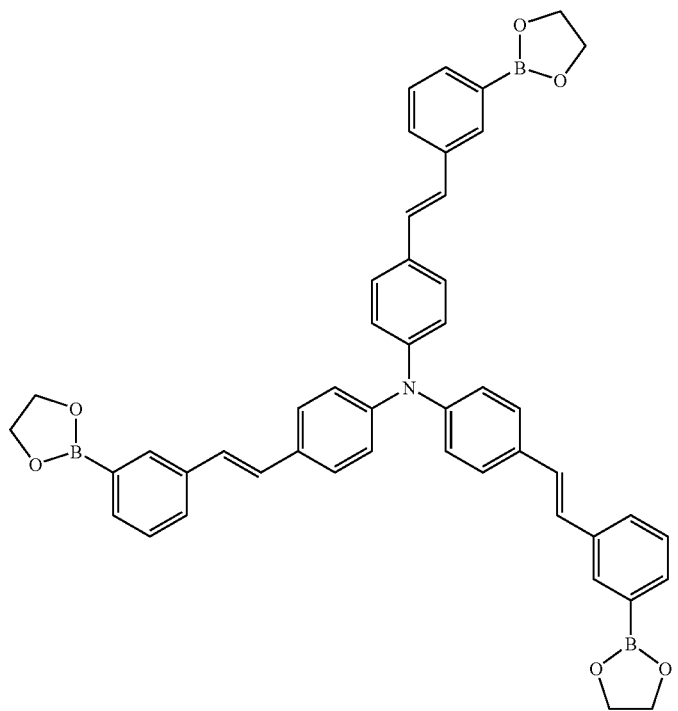

(S57)
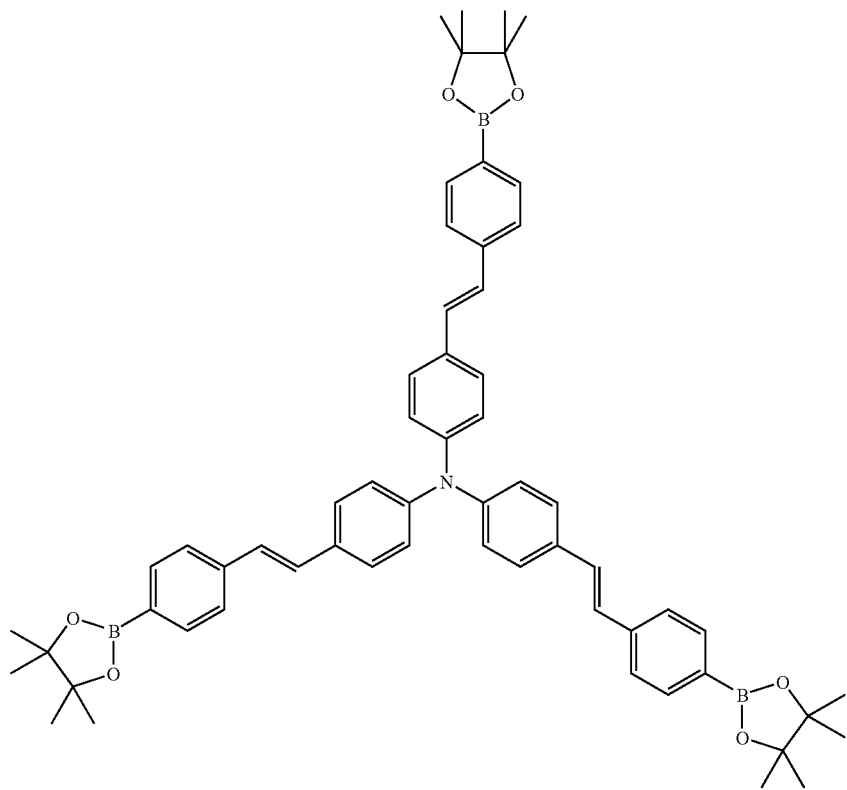
(S58)
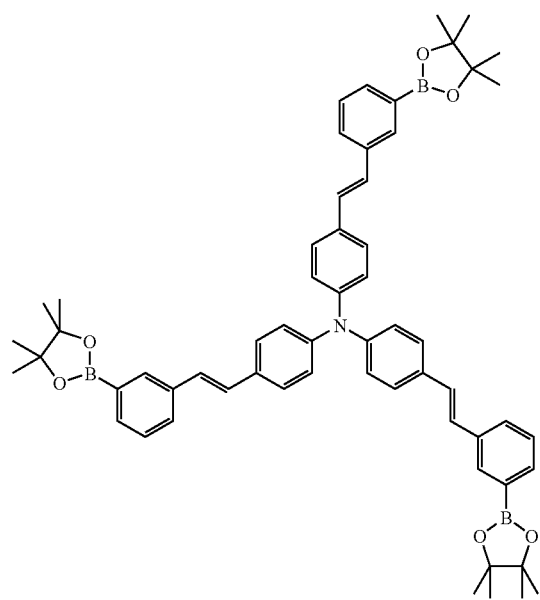
(S59)
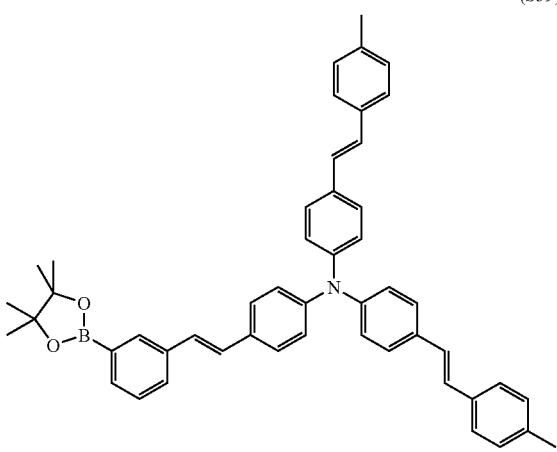

-continued
(S60)
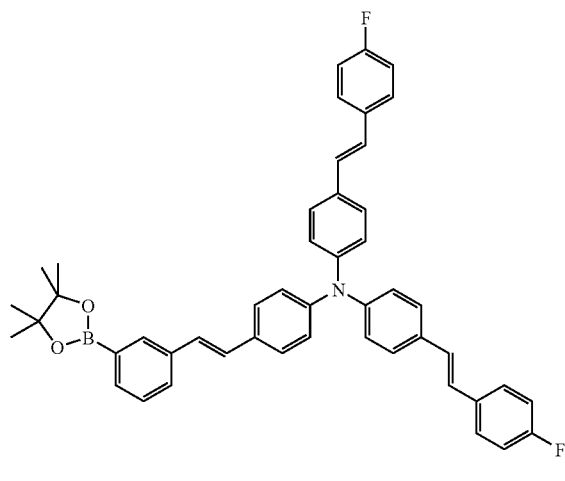
(S61)
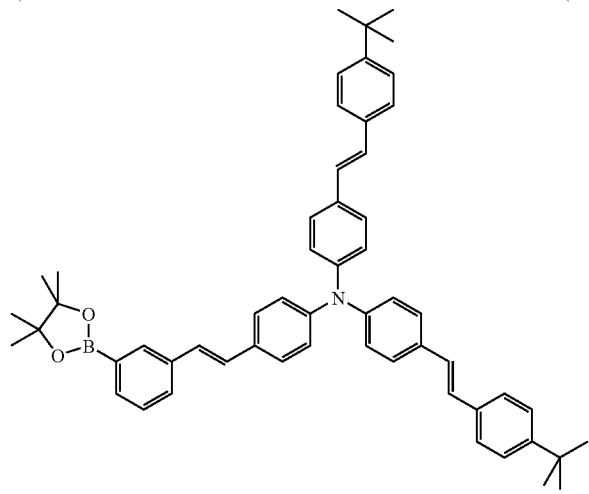
(S62)
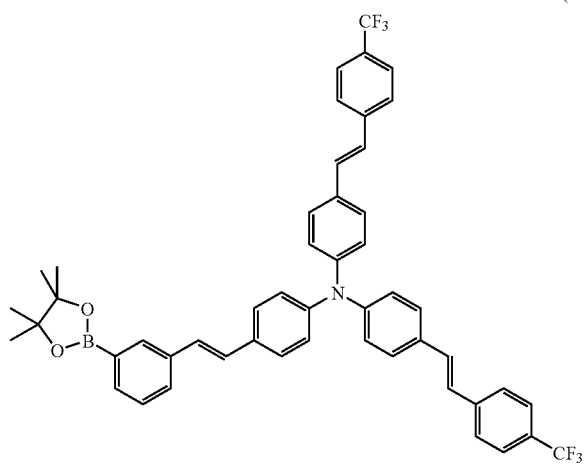
(S63)
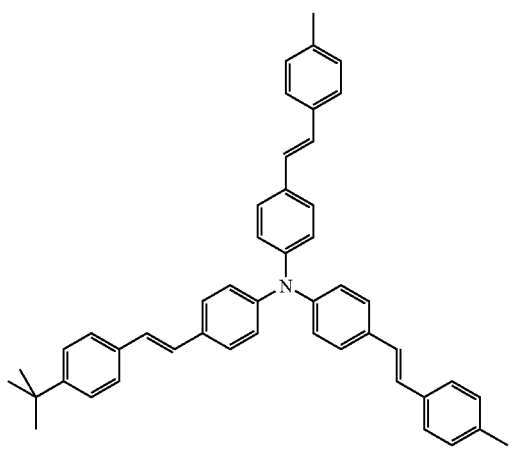
(S64)
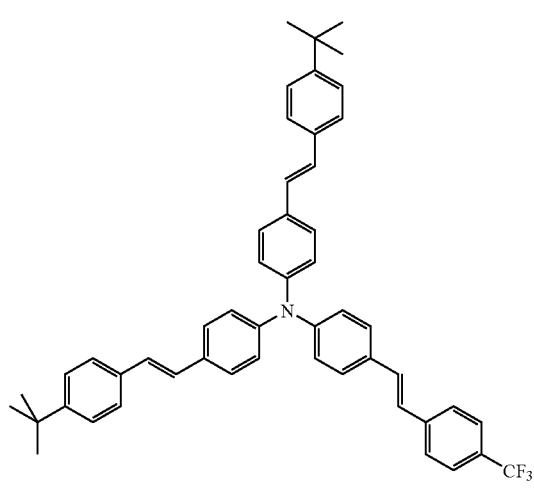
(S65)
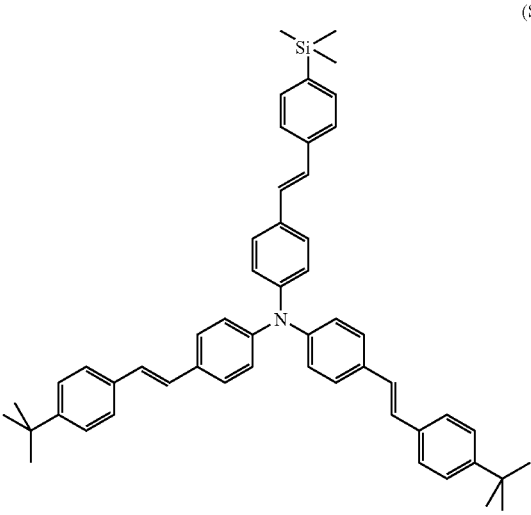

-continued
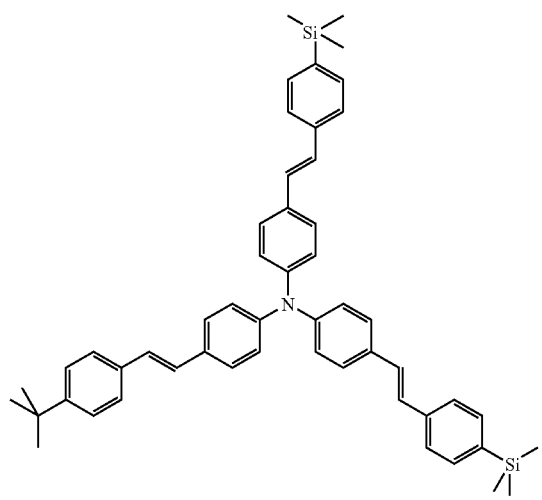
(S66)
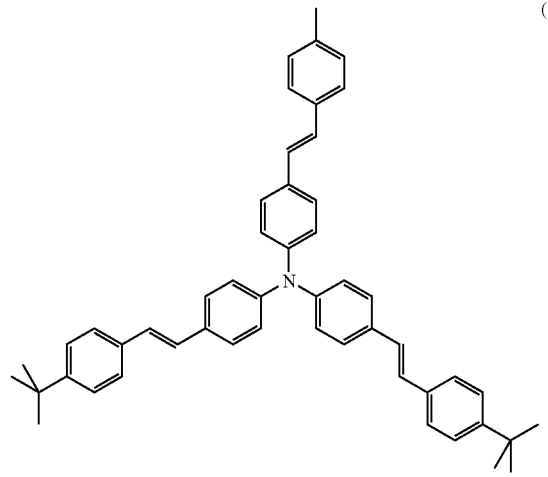
(S67)
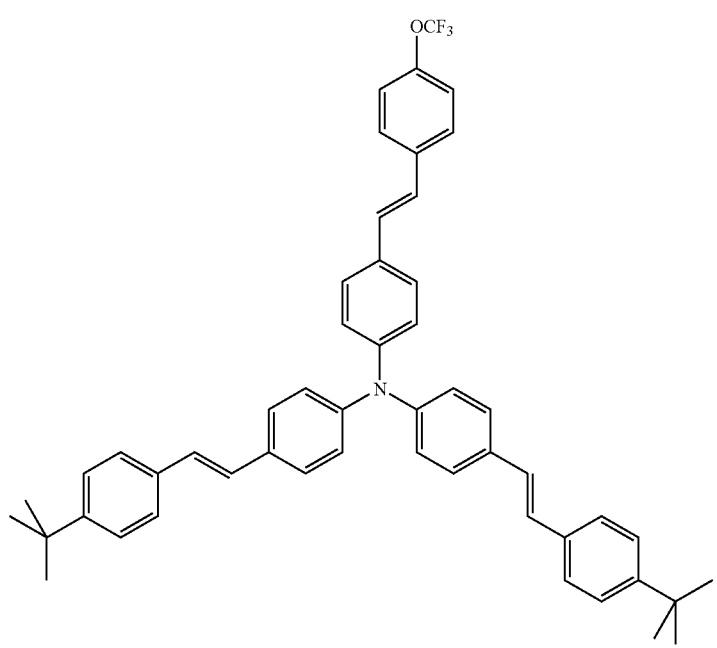
(S68)

-continued
(S69)
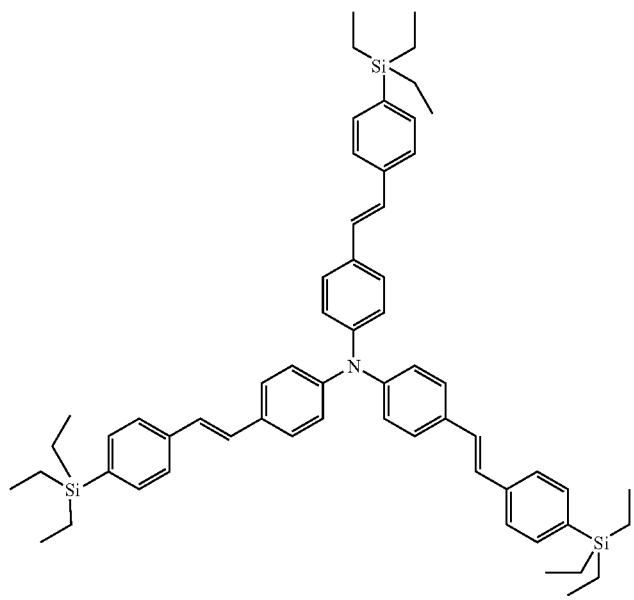
(S70)
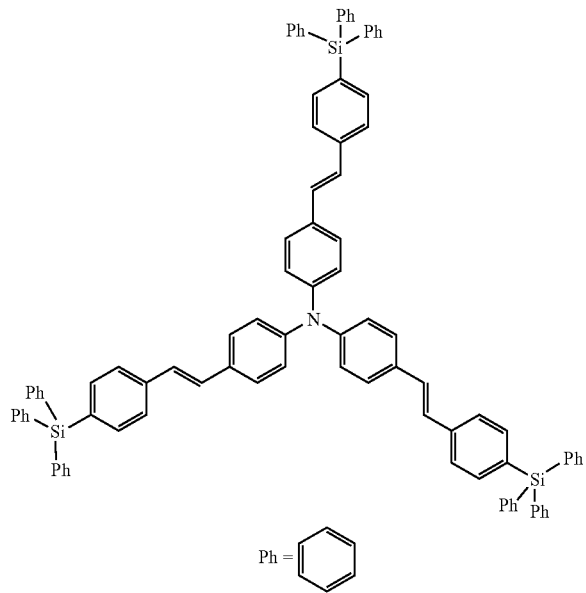

-continued
(S71)
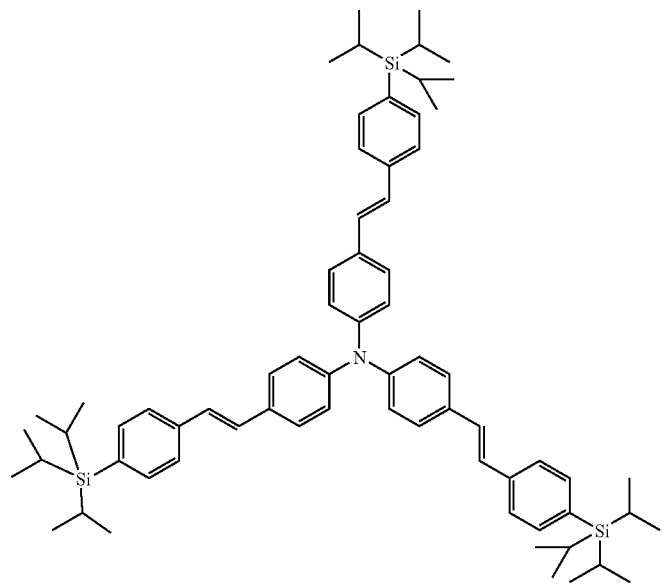
(S72)
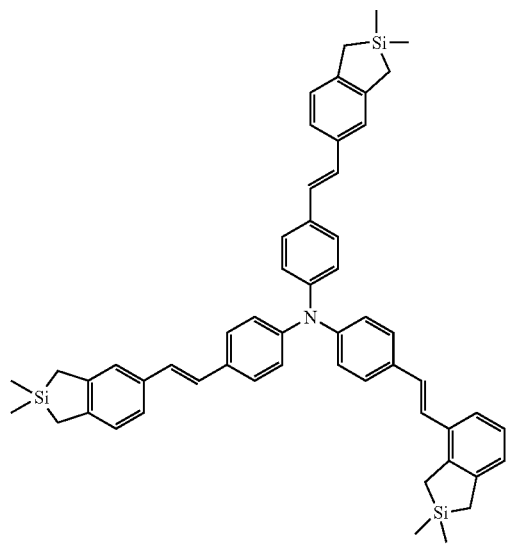
(S73)
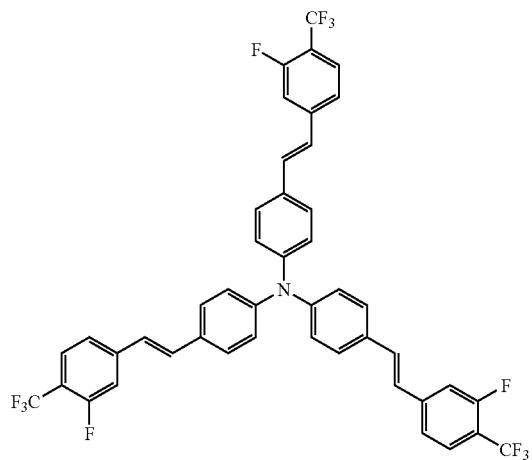

-continued
(S74)
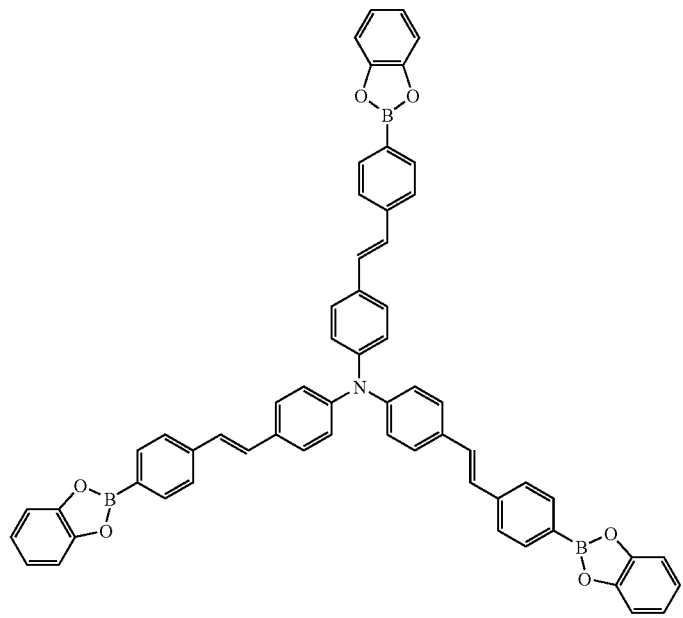
(S75)
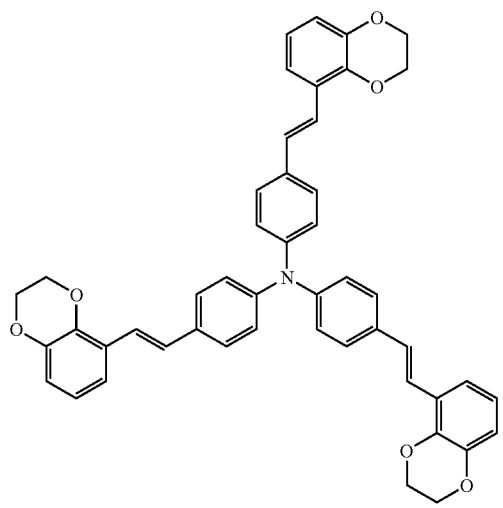
(S76)
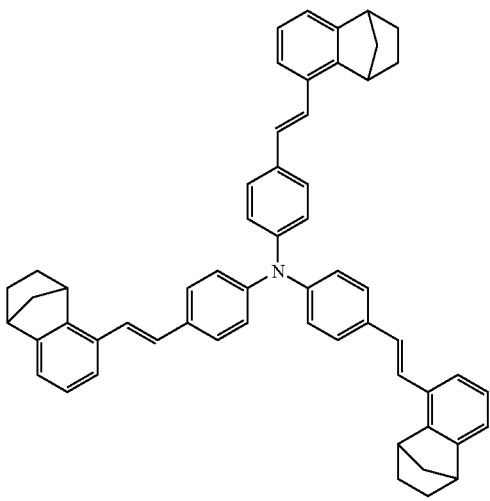
(S77)
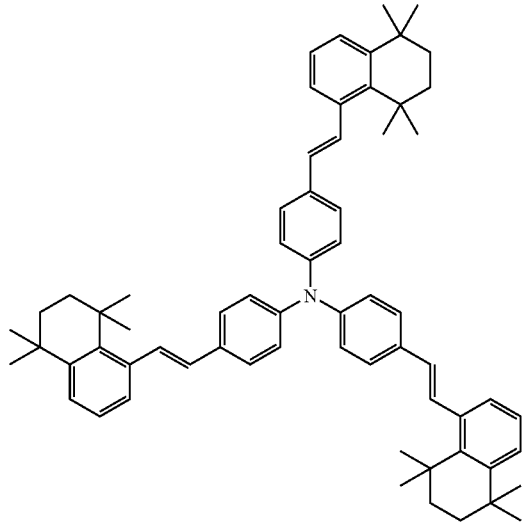
(S78)
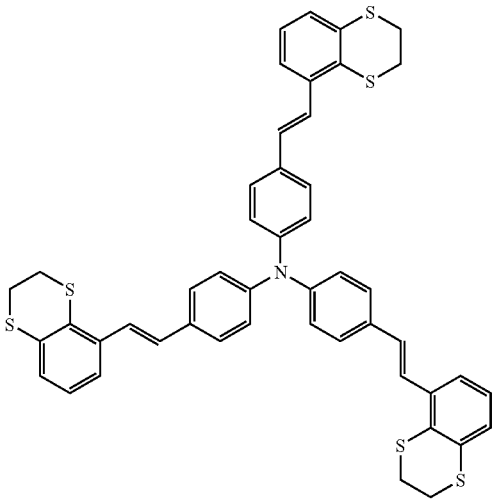

-continued
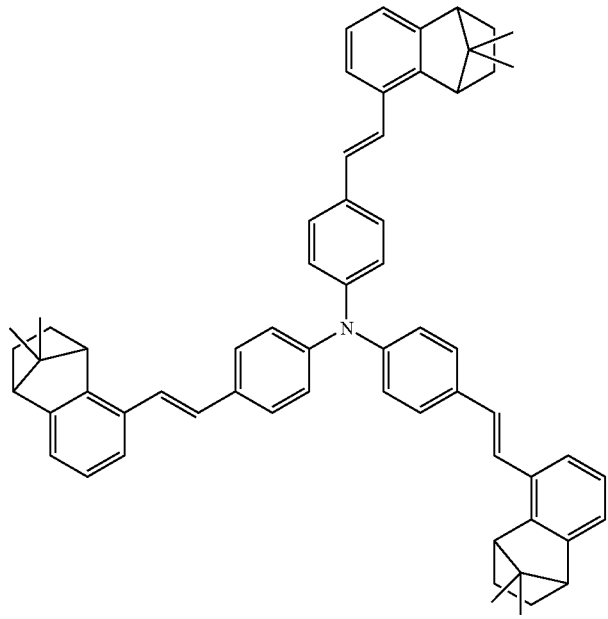
(S79)
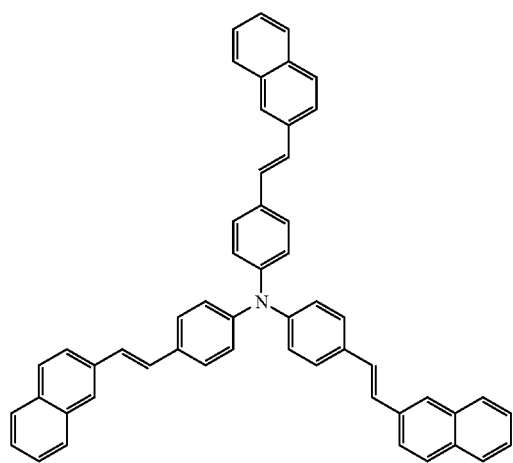
(S80)
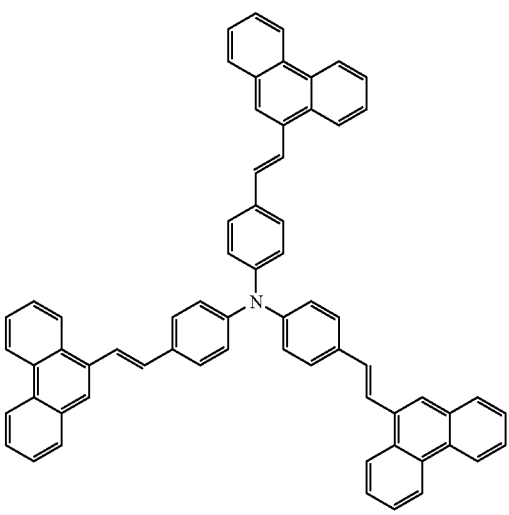
(S81)
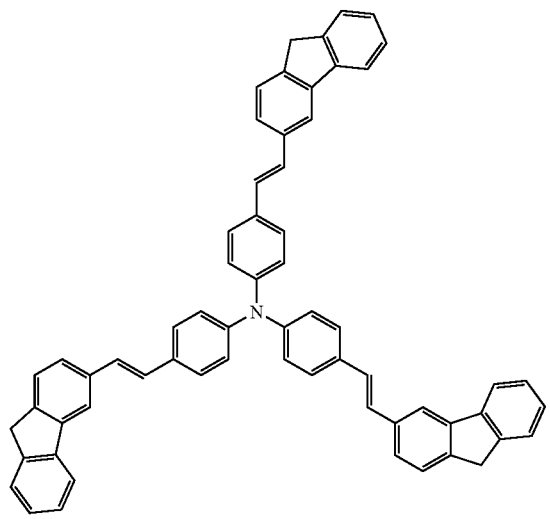
(S82)
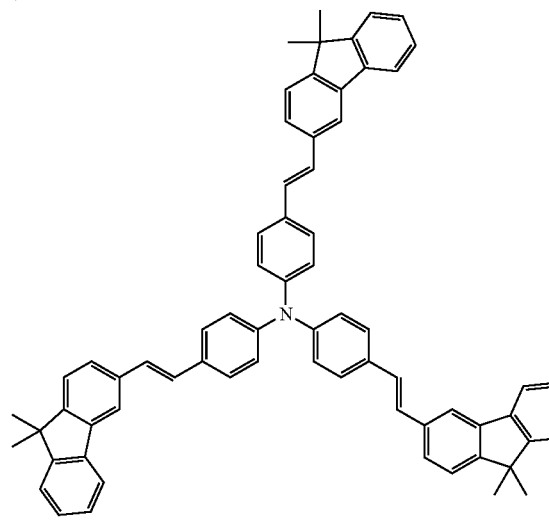
(S83)

-continued
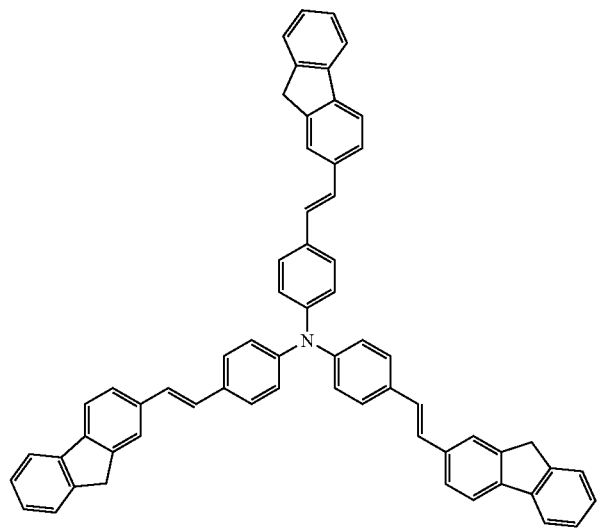
(S84)
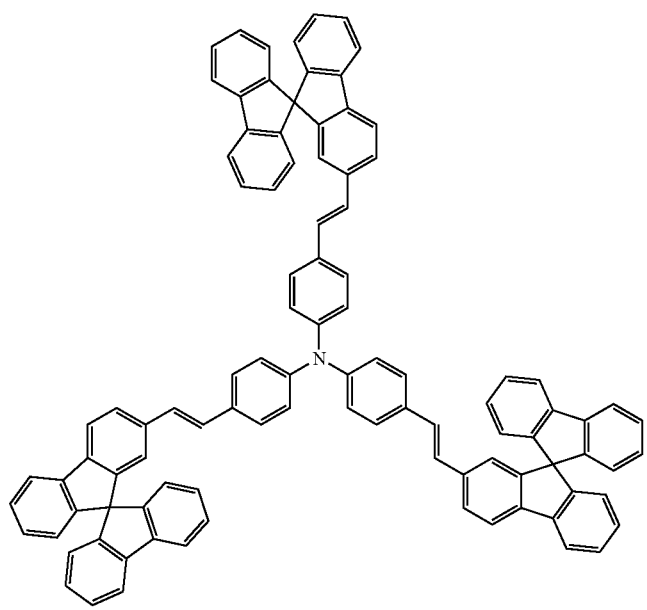
(S85)

-continued

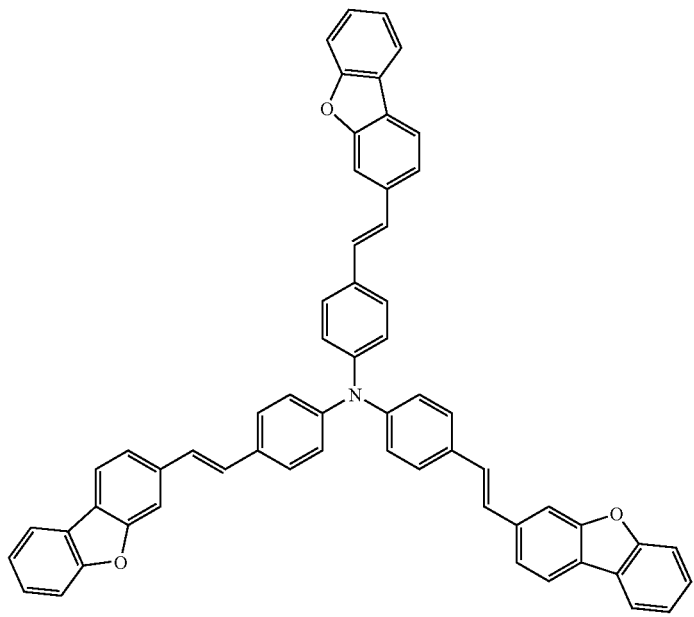
(S86)

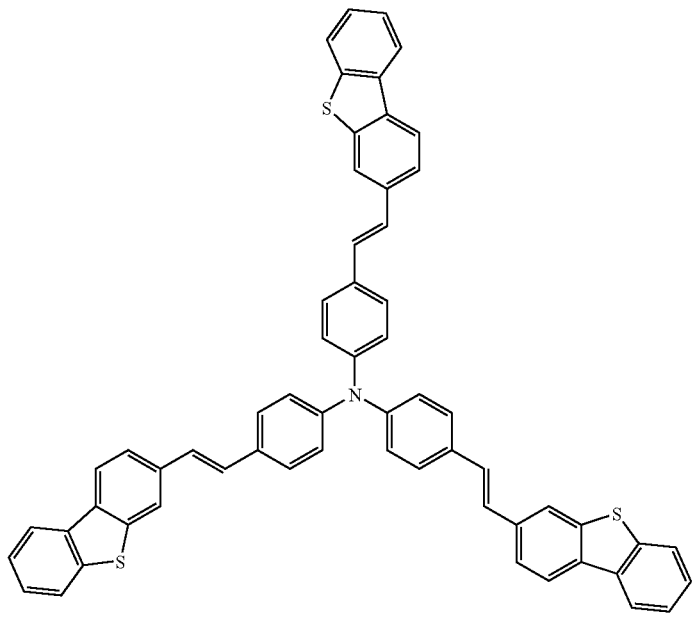
(S87)

Preferred embodiments of compounds of the formula (2) and formula (3) are described below.

Preference is given to compounds of the formula (2) and formula (3) in which the symbol $Ar^3$, identically or differently on each occurrence, stands for an aromatic or heteroaromatic ring system having 9 to 25 aromatic ring atoms, which may be substituted by one or more radicals $R^2$. Particular preference is given to compounds of the formula (2) and formula (3) in which the symbol $Ar^3$, identically or differently on each occurrence, stands for a condensed aryl or heteroaryl group having 10 to 16 aromatic ring atoms or for an aromatic, optionally bridged biaryl group, each of which may be substituted by one or more radicals $R^2$. Very particular preference is given to compounds of the formula (2) in which the symbol $Ar^3$, identically or differently on each occurrence, stands for a 1-naphthyl, 2-naphthyl, 9-anthryl, 2-phenanthrenyl, 9-phenanthrenyl, quinolinyl, isoquinolinyl, ortho-biphenyl, 2-fluorenyl or 2-spirobifluorenyl group, each of which may be substituted by one or more radicals $R^2$, in particular 1-naphthyl, which may be substituted by one or more radicals $R^2$.

Preference is furthermore given to compounds of the formula (2) and formula (3) in which the symbol $R^2$, identically or differently on each occurrence, stands for H, F, a straight-chain alkyl or alkoxy group having 1 to 6 C atoms or a branched or cyclic alkyl or alkoxy group having 3 to 10 C atoms, where in each case one or more $CH_2$ groups may be replaced by $Si(R^3)_2$, —$R^3C$=$CR^3$—, —O—, —S— or —$N(R^3)$— and where in each case one or more H atoms may be replaced by F, or an aryl or heteroaryl group having 5 to 14 aromatic ring atoms, or a combination of two or three of these systems; two or more radicals $R^2$ here may also form a mono- or polycyclic, aliphatic or aromatic ring system with one another. Particularly preferred radicals $R^2$ are selected from the group consisting of H, F, straight-chain alkyl groups having 1 to 4 C atoms, branched alkyl groups having 3 to 5 C atoms or cyclic alkyl groups having 5 to 10 C atoms, where in each case one or more H atoms may be replaced by F, or aryl or heteroaryl groups having 6 to 10 aromatic ring atoms, or a combination of two of these systems; two or more adjacent radicals $R^2$ here may also form a mono- or polycyclic, aliphatic or aromatic ring system with one another.

Preference is furthermore given to compounds of the formula (3) in which the symbol X, identically or differently on each occurrence, represents a linear alkylene group having 1 to 10 C atoms or a branched or cyclic alkylene or alkylidene group having 3 to 10 C atoms, a divalent aromatic group having 6 to 25 C atoms, —O—, —S— or a group of the formula —N($R^3$)— or —P(=O)$R^3$— or a single bond.

Preference is furthermore given to compounds of the formula (2) or formula (3) in which the symbol $R^4$, identically or differently on each occurrence, stands for H, F, a straight-chain alkyl or alkoxy group having 1 to 6 C atoms or a branched or cyclic alkyl or alkoxy group having 3 to 10 C atoms, where in each case one or more $CH_2$ groups may be replaced by —$R^3$C=C$R^3$—, Si($R^3$)$_2$, —O—, —S— or —N($R^3$)— and where in each case one or more H atoms may be replaced by F, or an aryl or heteroaryl group having 5 to 14 aromatic ring atoms, or a combination of two or three of these systems; two or more radicals $R^4$ here may also form a mono- or polycyclic, aliphatic ring system with one another. Particularly preferred radicals $R^4$ are selected from the group consisting of H, F, straight-chain alkyl groups having 1 to 4 C atoms, branched alkyl groups having 3 to 5 C atoms or cyclic alkyl groups having 5 to 10 C atoms, where in each case one or more H atoms may be replaced by F, or aryl or heteroaryl groups having 6 to 10 aromatic ring atoms, or a combination of two of these systems; two or more adjacent radicals $R^4$ here may also form a mono- or polycyclic, aliphatic ring system with one another.

Preference is furthermore given to compounds of the formula (2) or formula (3) in which the index n stands for 0, 1 or 2, particularly preferably 0 or 1. If the index n stands for 1, the substituent $R^4$ is preferably bonded in the 2-position and/or in the 6-position of the anthracene.

Preference is furthermore given to compounds of the formula (2) or formula (3) whose molecular weight is between 400 and 1200 g/mol, particularly preferably between 400 and 900 g/mol.

The compounds of the formula (2) or formula (3) are preferably pure hydrocarbon compounds.

It should be emphasised here that both compounds of the formula (2) or formula (3) in which the two groups $Ar^3$ are selected identically and also compounds of the formula (2) or formula (3) in which the two groups $Ar^3$ are different are in accordance with the invention.

Preference is furthermore given to compounds of the formula (2) or formula (3) which have hindered rotation about the $Ar^3$-anthracene bond or where appropriate also about the anthracene-X bond and which are thus capable of the formation of atropisomers. For the purposes of this invention, "hindered rotation" is taken to mean a rotation barrier of at least 80 kJ/mol, preferably at least 100 kJ/mol, particularly preferably at least 120 kJ/mol, at room temperature. This rotation barrier can be determined experimentally by temperature-dependent NMR measurements. Compounds of the formula (2) or formula (3) of this type are described, for example, in WO 06/048268. If the compound of the formula (2) or formula (3) exhibits atropisomerism about one or more bonds, as described above, the invention in each case also relates to OLEDs comprising the corresponding isolated or enriched atropisomers. This relates both to enantiomers and also to diastereomers. The choice of suitable atropisomers enables, for example, the solubility of the compound and the electro-optical properties to be influenced.

Examples of preferred compounds of the formula (2) and formula (3) are compounds (A1) to (A64) depicted below.

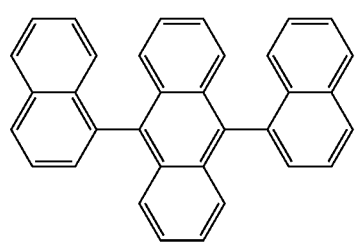

(A1)

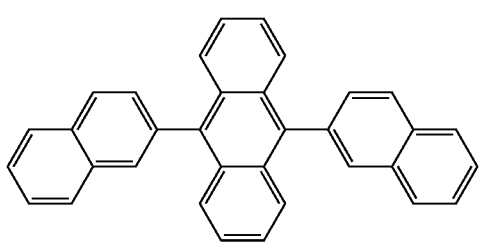

(A2)

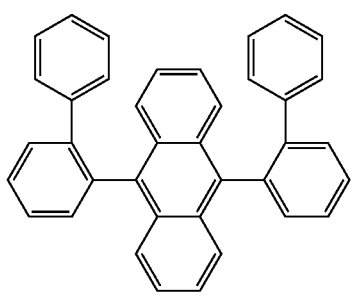

(A3)

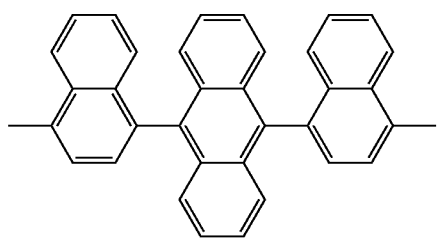

(A4)

-continued
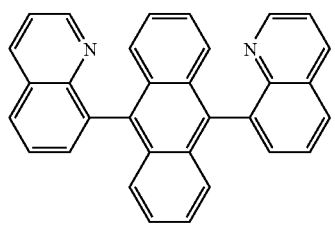
(A5)
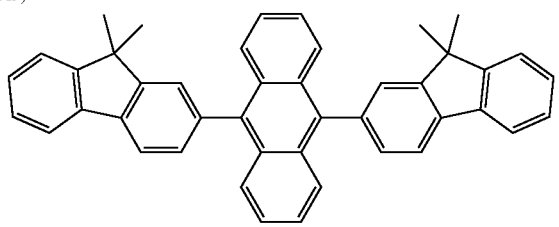
(A6)
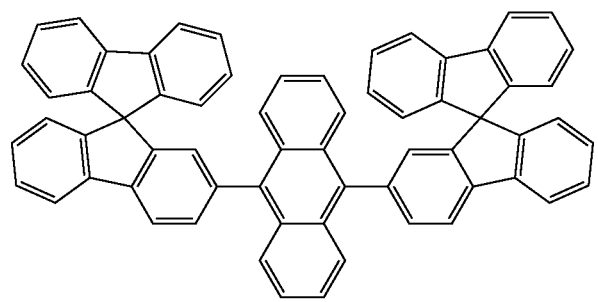
(A7)
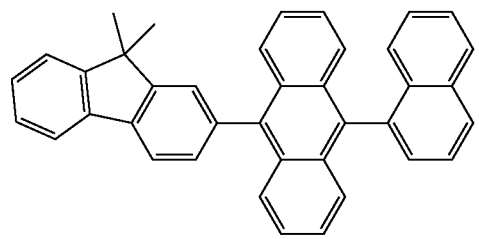
(A8)
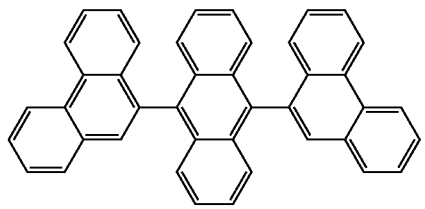
(A9)
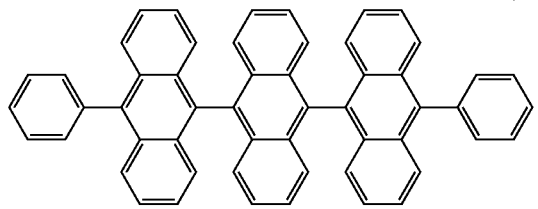
(A10)
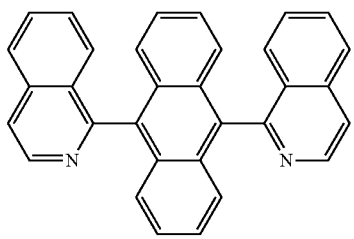
(A11)
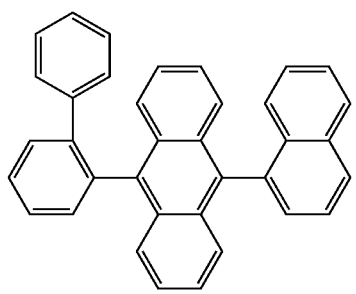
(A12)

-continued
(A13)
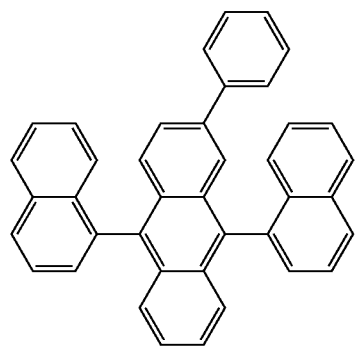
(A14)
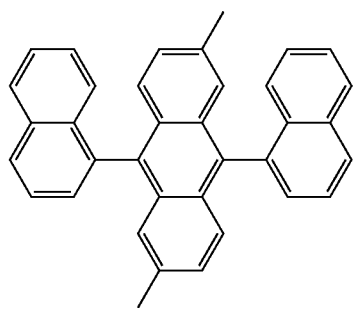
(A15)
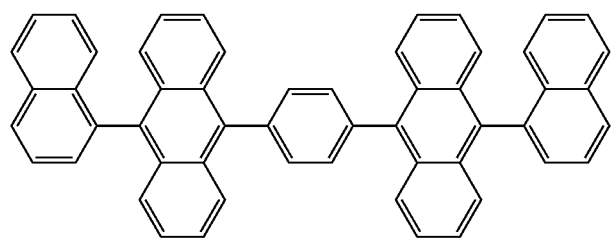
(A16)
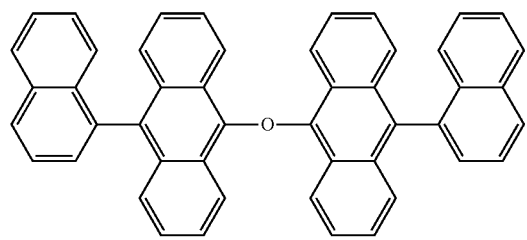
(A17)
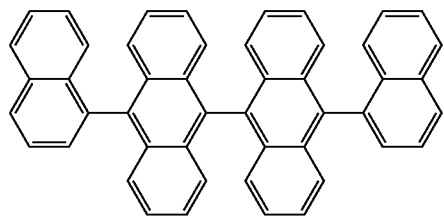
(A18)
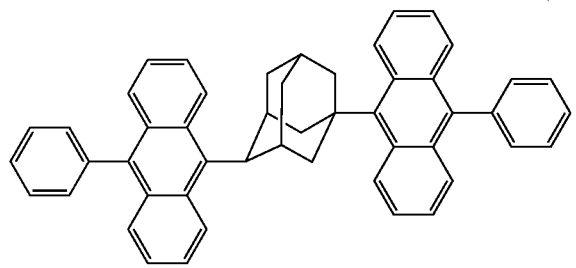
(A19)
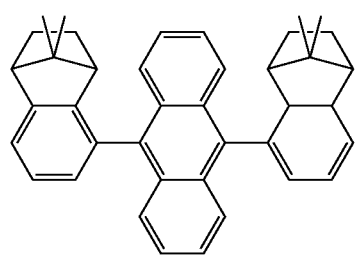
(A20)
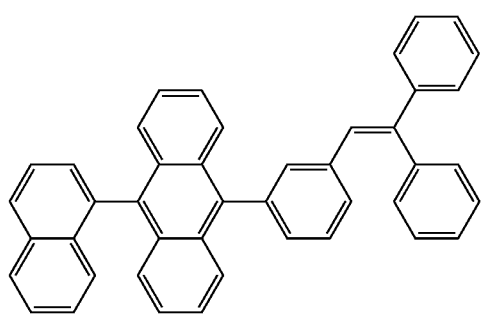

-continued
(A21) 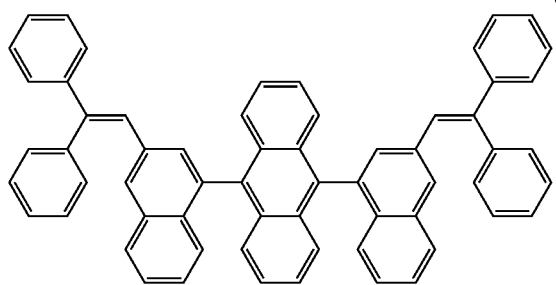
(A22) 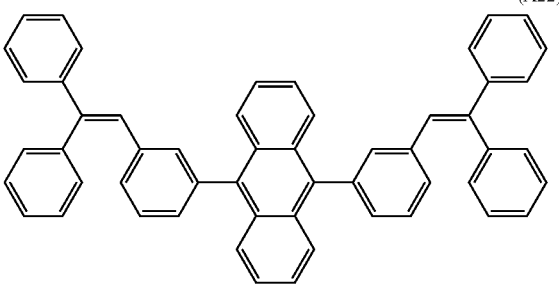
(A23) 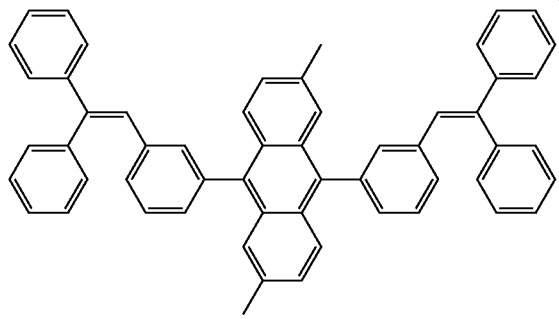
(A24) 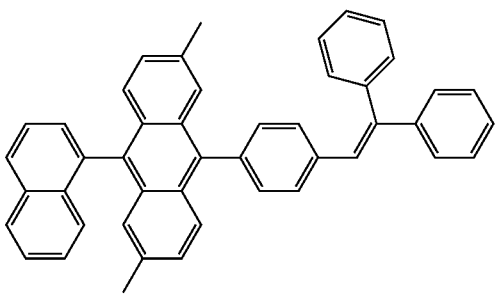
(A25) 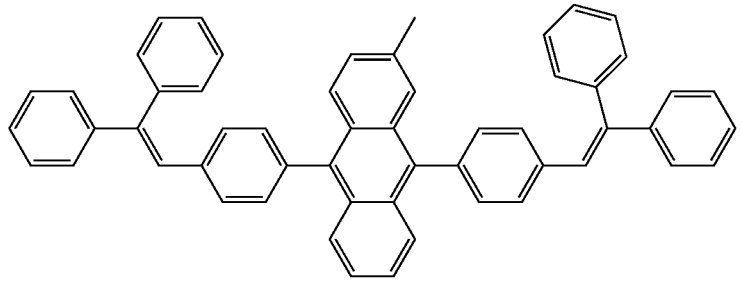
(A26) 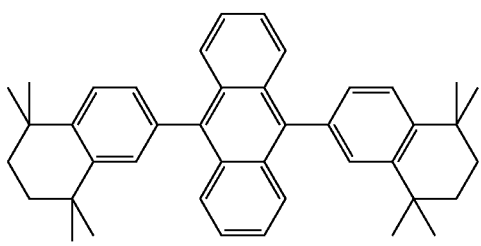
(A27) 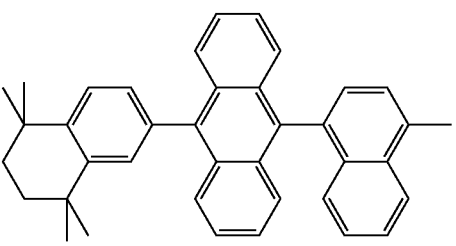
(A28) 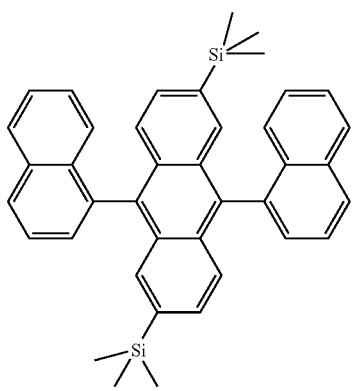
(A29) 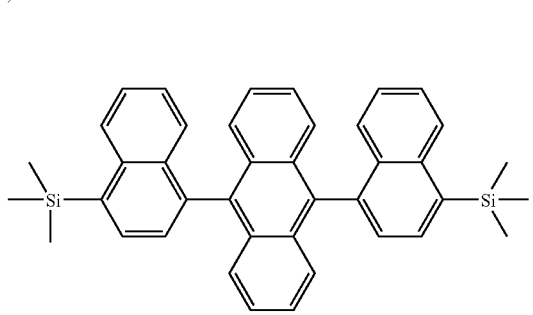

(A30)
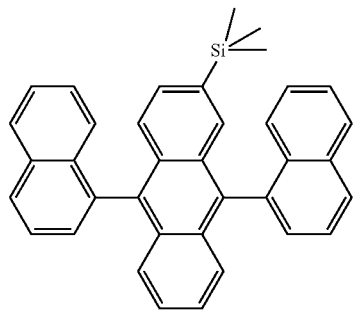
(A31)
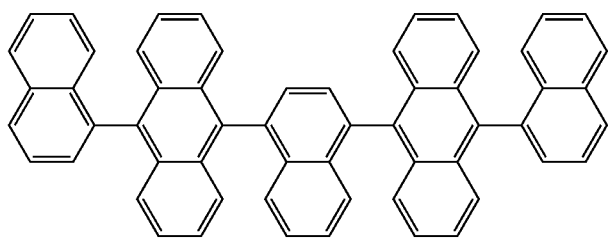
(A32)
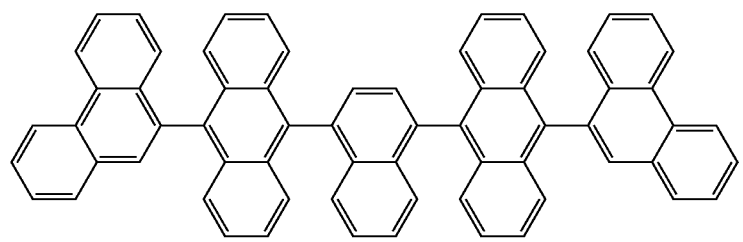
(A33)
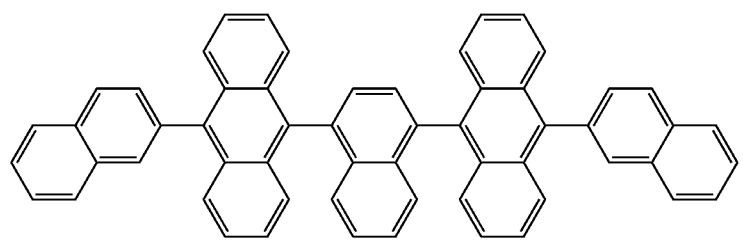
(A34)
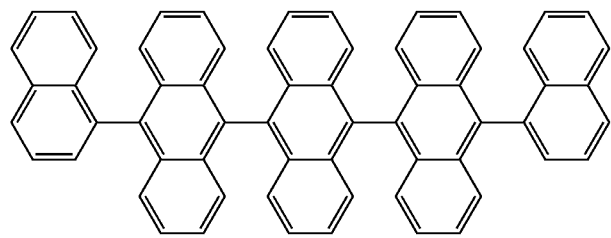
(A35)
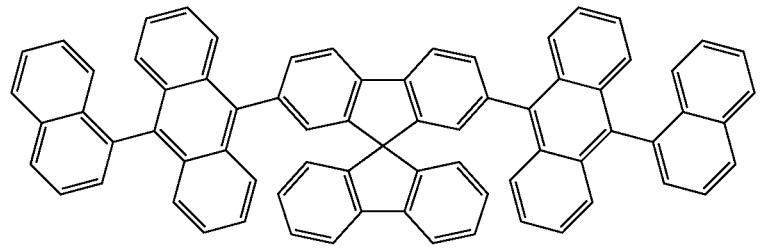

-continued
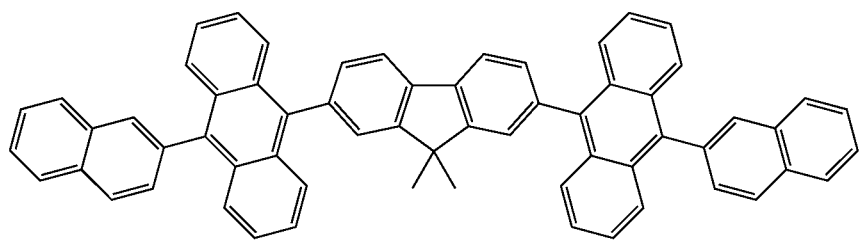
(A36)
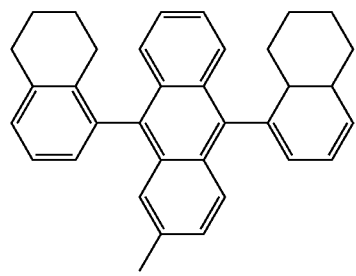
(A37)
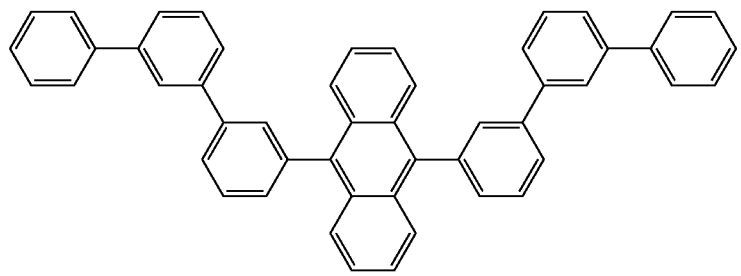
(A38)
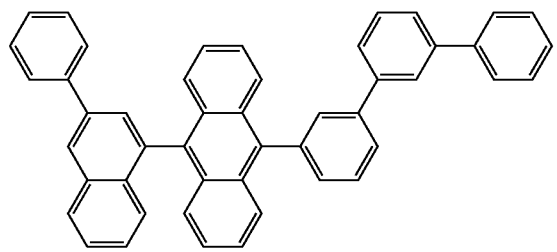
(A39)
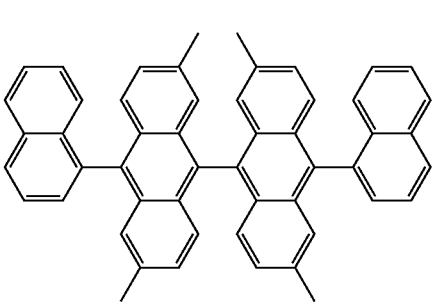
(A40)
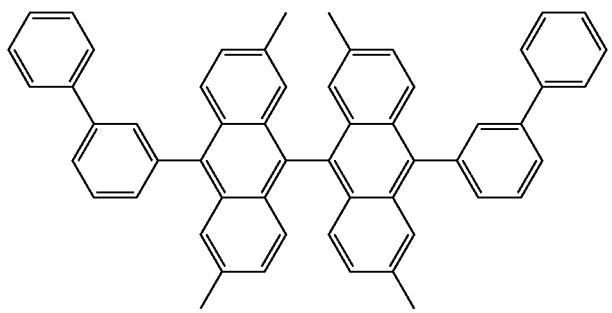
(A41)

-continued
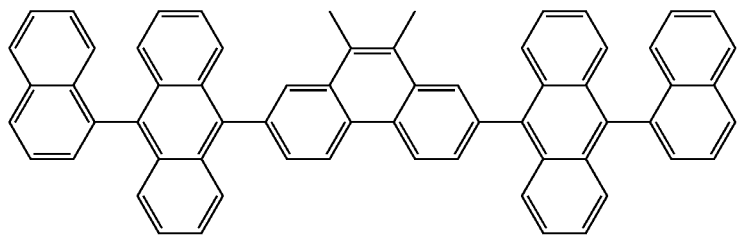
(A42)
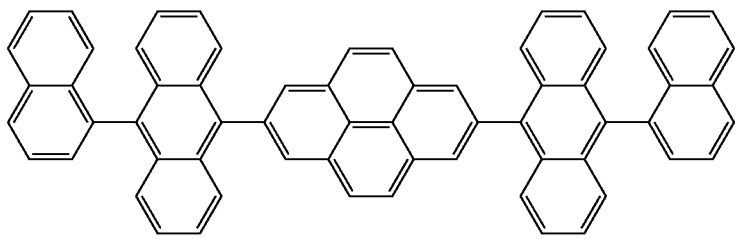
(A43)
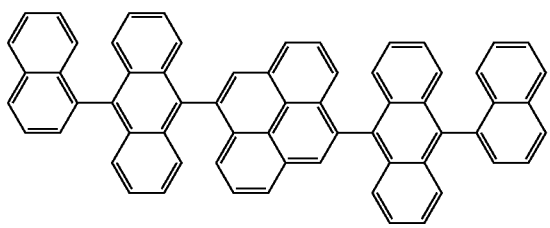
(A44)
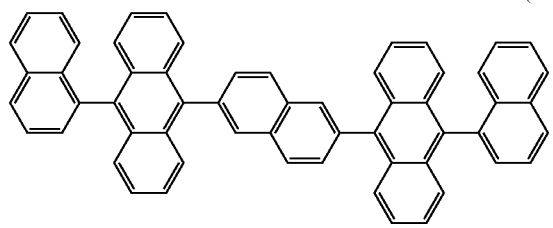
(A45)
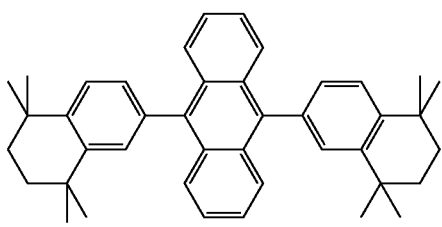
(A46)
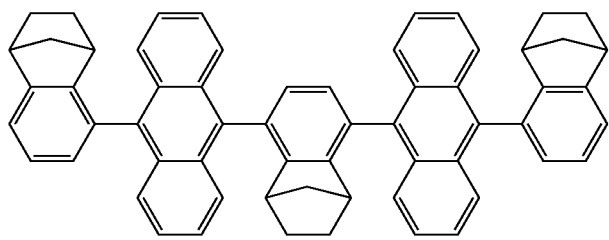
(A47)
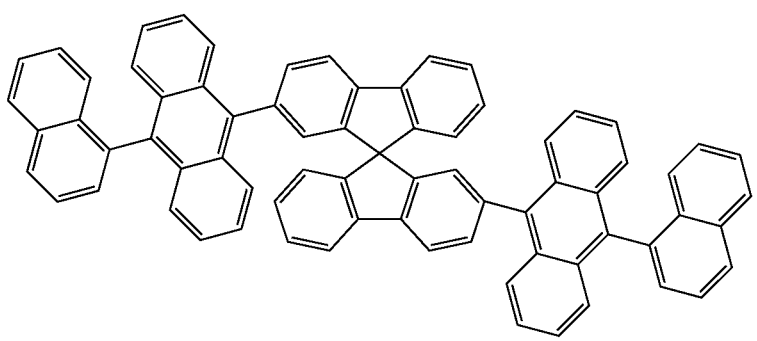
(A48)
(A49)

-continued
(A50)
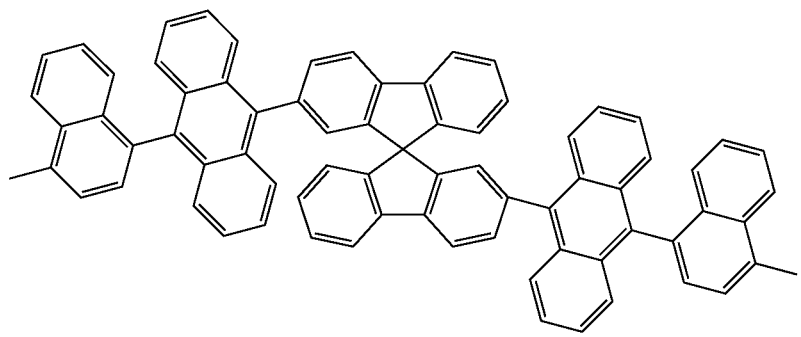
(A51) (A52)
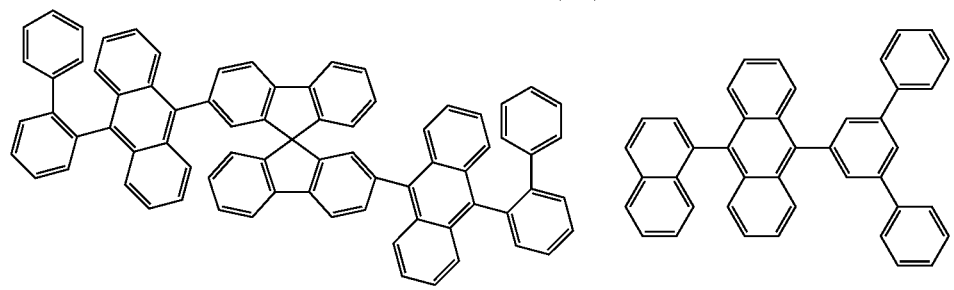
(A53) (A54)
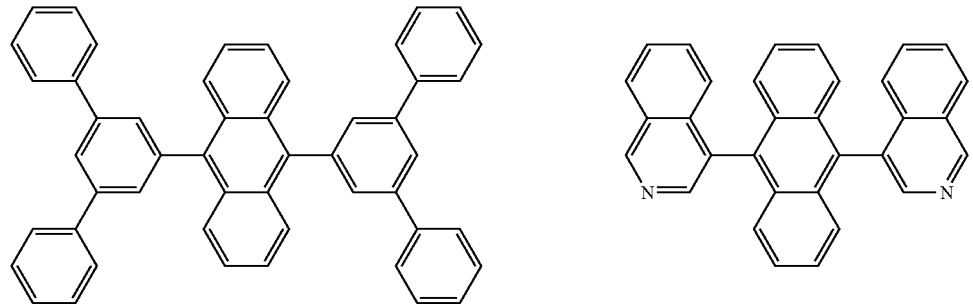
(A55) (A56)
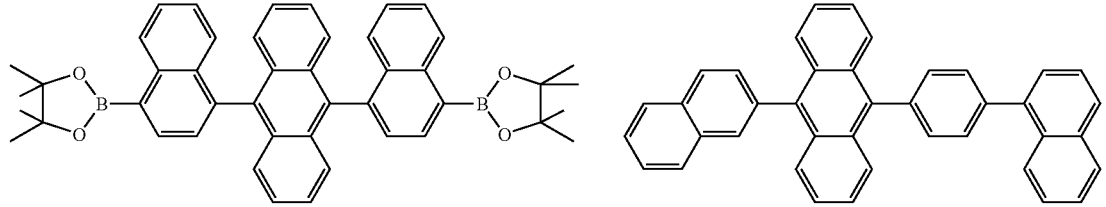
(A57) (A58)
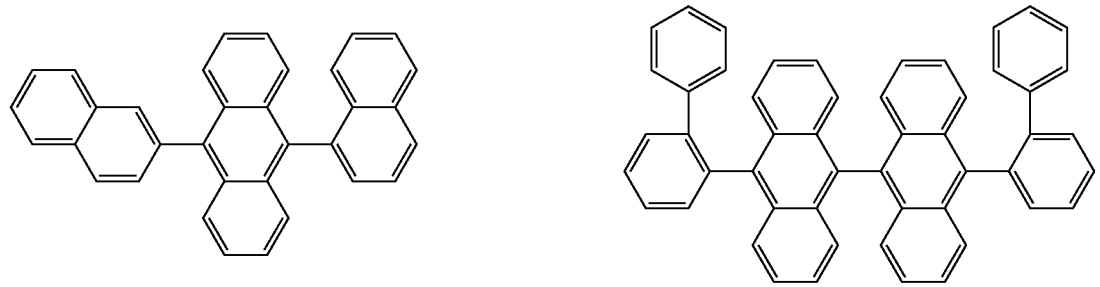

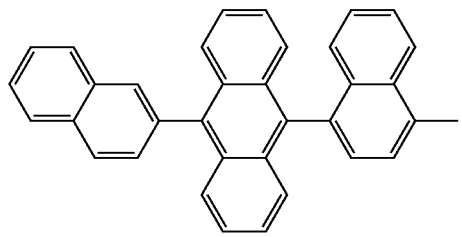
(A59)

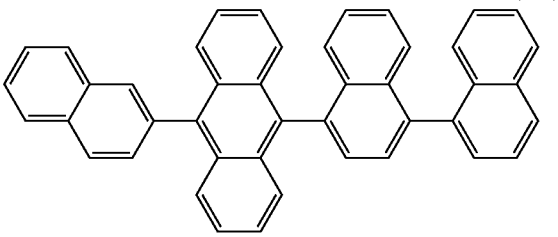
(A60)

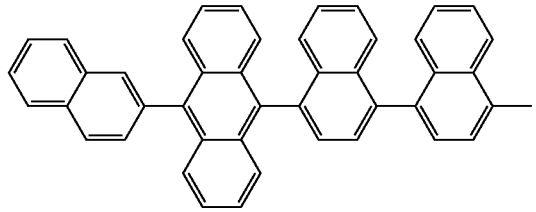
(A61)

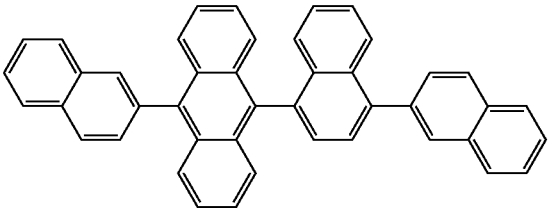
(A62)

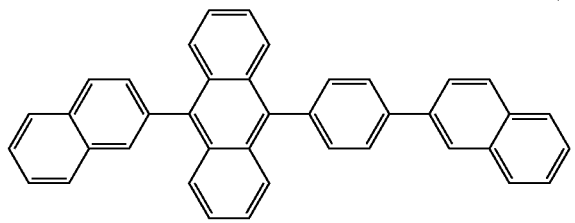
(A63)

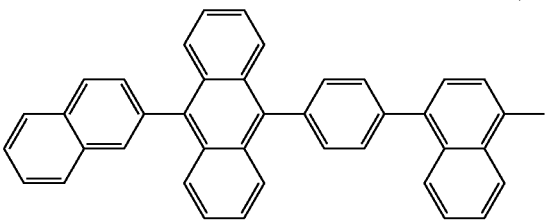
(A64)

The proportion of the compound of the formula (1) or formula (1a) in the mixture is between 0.1 and 99.0% by weight, preferably between 0.5 and 50.0% by weight, particularly preferably between 1.0 and 20.0% by weight, in particular between 1.0 and 10.0% by weight. Correspondingly, the proportion of the compound of the formula (2) or formula (3) in the mixture is between 1.0 and 99.9% by weight, preferably between 50.0 and 99.5% by weight, particularly preferably between 80.0 and 99.0% by weight, in particular between 90.0 and 99.0% by weight.

Preference is furthermore given to organic electroluminescent devices, characterised in that a plurality of emitting layers are used, where at least one of these layers comprises at least one compound of the formula (1) or formula (1a) and at least one compound of the formula (2) or formula (3). These emission layers particularly preferably have in total a plurality of emission maxima between 380 nm and 750 nm, resulting overall in white emission, i.e. at least one further emitting compound which is able to fluoresce or phosphoresce and emits yellow, orange or red light is also used in the further emitting layer(s). Particular preference is given to three-layer systems in which at least one of these layers comprises at least one compound of the formula (1) or formula (1a) and a compound of the formula (2) or formula (3) and where the three layers exhibit blue, green and orange or red emission (for the basic structure, see, for example, WO 05/011013).

Apart from the compounds of the formula (1) or formula (1a) and formula (2) or formula (3), further substances may also be present in the emitting layer, for example hole- or electron-transport materials.

Apart from the cathode, anode and emitting layer (or emitting layers), the organic electroluminescent device may also comprise further layers. These can be, for example: hole-injection layer, hole-transport layer, electron-transport layer and/or electron-injection layer. The materials in these layers may also be doped. However, each of these layers does not necessarily have to be present. Suitable hole-transport materials are, for example, aromatic amines, as usually used in accordance with the prior art, which may also be p-doped. Suitable electron-transport materials are, for example, metal chelate complexes, for example $AlQ_3$, compounds based on electron-deficient heterocycles, for example triazine derivatives, or compounds containing aromatic carbonyls or phosphine oxides, as described, for example, in WO 05/084081 and WO 05/084082, which may also in each case be n-doped. Suitable electron-injection materials are, in particular, fluorides and oxides of the alkali and alkaline earth metals, for example NaF, $BaF_2$, $CaF_2$, LiF or $Li_2O$.

Preference is furthermore given to an organic electroluminescent device, characterised in that one or more layers are coated by means of a sublimation method, in which the materials are vapour-deposited in vacuum sublimation units at a pressure below $10^{-5}$ mbar, preferably below $10^{-6}$ mbar, particularly preferably below $10^{-7}$ mbar.

Preference is likewise given to an organic electroluminescent device, characterised in that one or more layers are coated by means of the OVPD (organic vapour phase deposition) method or with the aid of carrier-gas sublimation, where the materials are applied at a pressure between $10^{-7}$ mbar and 1 bar.

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermotransfer printing) or inkjet printing. Soluble compounds of the formula (1) and formula (2) or formula (3) are necessary for this purpose. High solubility can be achieved either through suitable substitution of the compounds or alternatively through the choice of suitable atropisomers.

The invention furthermore relates to a process for the production of organic electroluminescent devices, characterised in that at least one compound of the formula (1) is applied together with at least one compound of the formula (2) and/or formula (3) by a sublimation method or from solution, for example by a printing process.

The invention furthermore relates to mixtures comprising at least one compound of the formula (1) or formula (1a) and at least one compound of the formula (2) or formula (3), where the preferences given above apply to the mixtures.

The invention furthermore relates to the use of the mixtures according to the invention for the production of organic electronic devices, in particular organic electroluminescent devices.

The organic electroluminescent devices according to the invention have the following surprising advantages over the prior art:

1. The stability of the devices becomes higher compared with systems in accordance with the prior art, which is evident, in particular, from a significantly longer lifetime.
2. The emission colour of the devices is significantly darker blue compared with devices comprising the systems in accordance with the prior art that are usually used. The devices according to the invention are thus more suitable for use in high-quality full-colour displays.
3. The compounds can be sublimed and vapour-deposited well and without significant decomposition, are consequently easier to process and are therefore more suitable for use in OLEDs than materials in accordance with the prior art.

The present application text and also the examples below are directed to the use of mixtures according to the invention in relation to OLEDs and the corresponding displays.

In spite of this restriction of the description, it is possible for the person skilled in the art, without further inventive step, also to use the mixtures according to the invention for further uses in other electronic devices, for example for organic field-effect transistors (O-FETs), organic thin-film transistors (O-TFTs), organic light-emitting transistors (O-LETs), organic integrated circuits (O-ICs), organic solar cells (O-SCs), organic field-quench devices (O-FQDs), organic photoreceptors or organic laser diodes (O-lasers).

The present invention furthermore relates to the use of the mixtures according to the invention in the corresponding devices and also to these devices themselves.

The invention is explained in greater detail by the following examples without wishing it to be restricted thereby.

EXAMPLES

The following syntheses are carried out under a protective-gas atmosphere, unless indicated otherwise. The starting materials can be purchased from ALDRICH (tris(4-bromophenyl)amine, 4-tert-butylstyrene, 4-fluorostyrene, palladium(II) acetate, N,N-dimethylglycine, inorganics, solvents) and from Epsilon Chimie Products (diethyl 4-bromobenzyl phosphonate). Tris(4-formylphenyl)amine can be prepared as described in *Synthesis* 2005, 11, 1771. Tris[(phenylvinyl)phenyl]amine can be synthesised as described in *Macromolecules* 1996, 29, 7705, 4-Trifluoromethoxystyrene can be prepared as described in *J. Org. Chem.* 1964, 29, 1. 6-Ethenyl-1,2,3,4-tetrahydro-1,1,4,4-tetramethylnaphthalene can be prepared as described in *J. Med. Chem.* 1989, 32, 1504.

Example 1

Tris(phenylvinylphenyl)amine (dopant D1)

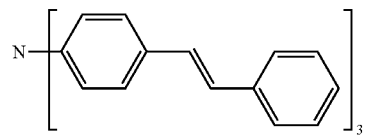

A mixture of 24.1 g (50 mmol) of tris(4-bromophenyl)amine, 25.8 ml (225 mmol) of styrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water each time. After drying over sodium sulfate, the organic phase is evaporated to dryness. The yellow solid obtained in this way is recrystallised six times from toluene, then washed twice by stirring with 500 ml of ethanol under reflux each time and subsequently sublimed three times under reduced pressure (T=350° C., p=5×10$^{-5}$ mbar), giving 18.8 g (34 mmol) (corresponding to 68.1% of theory) of the product having a purity of greater than 99.5% according to HPLC.

Example 2

Tris[4-(methylphenylvinyl)phenyl]amine (dopant D2)

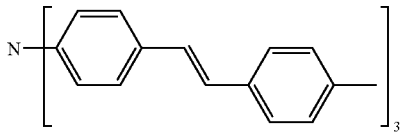

A mixture of 24.1 g (50 mmol) of tris(4-bromophenyl)amine, 29.6 ml (225 mmol) of 4-methylstyrene, 337 mg (1.5 mmol) of palladium(II) acetate, 1.55 g (15 mmol) of N,N-dimethylglycine, 81 mg (0.5 mmol) of iron(II) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water each time. After drying over sodium sulfate, the organic phase is evaporated to dryness. The yellow solid obtained in this way is recrystallised six times from toluene, then washed twice by stirring with 500 ml of ethanol under reflux each time and subsequently sublimed three times under reduced pressure (T=350° C., p=5×10$^{-5}$ mbar), giving 15.7 g (26 mmol) (corresponding to 52.8% of theory) of the product having a purity of greater than 99.5% according to HPLC.

Example 3

Tris[4-(tert-butylphenylvinyl)phenyl]amine (dopant D3)

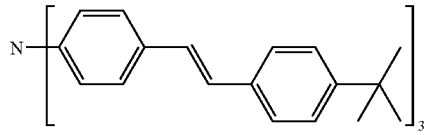

A mixture of 24.1 g (50 mmol) of tris(4-bromophenyl) amine, 42.4 ml (225 mmol) of 4-tert-butylstyrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water. After drying over sodium sulfate, the organic phase is evaporated to dryness. The yellow solid obtained in this way is recrystallised four times from dioxane and twice from toluene/n-heptane (2:1, v:v), then washed twice by stirring with 500 ml of ethanol under reflux and subsequently sublimed three times under reduced pressure (T=330° C., p=5×10$^{-5}$ mbar), giving 17.4 g (24 mmol) (corresponding to 48.3% of theory) of the product having a purity of greater than 99.5% according to HPLC.

Example 4

Tris(4-(trimethylsilylphenylvinyl)phenyl)amine (dopant D4)

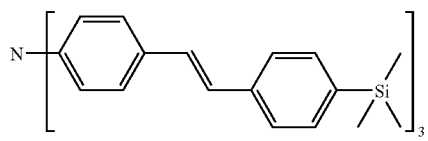

a) Tris(4-bromophenylvinylphenyl)amine 112.5 g (1.17 mol) of sodium tert-butoxide are added with vigorous stirring to a mixture, cooled to 0° C., of 179.7 g (585 mmol) of diethyl (4-bromobenzyl)phosphonate and 1000 ml of DMF. The mixture is stirred at 0° C. for a further 30 min., and a solution of 49.6 g (150 mmol) of tris(4-formylphenyl) amine in 1000 ml of DMF is then added dropwise. The mixture is stirred at 0 to 5° C. for a further 3 h and then hydrolysed with ice-cooling by addition of a mixture of 250 ml of 2.5M HCl, 600 ml of water and 200 ml of ethanol. The precipitated solid is filtered off with suction, washed three times with 300 ml of ethanol/water (1:1, v:v) each time and three times with 300 ml of ethanol each time and dried under reduced pressure. The solid is recrystallised from 300 ml of DMF, subsequently washed with 500 ml of boiling ethanol and dried under reduced pressure. Yield 97.2 g (123 mmol) (corresponding to 82.1% of theory) with a purity of 99.0% according to NMR.

b) Tris(4-(trimethylsilylphenylvinyl)phenyl)amine 100 ml (250 mmol) of n-BuLi (2.5M in n-hexane) are added dropwise at room temperature to a vigorously stirred suspension of 39.4 g (50 mmol) of tris(4-bromophenylvinylphenyl)amine in 1000 ml of diethyl ether, and the mixture is stirred at room temperature for a further 3 h. The solution obtained in this way is cooled to −78° C., a mixture of 57.5 ml (450 mmol) of chlorotrimethylsilane in 100 ml of diethyl ether is added, and the mixture is slowly warmed to room temperature. After addition of 500 ml of water, the organic phase is separated off, dried over magnesium sulfate and evaporated. The yellow solid obtained in this way is recrystallised five times from toluene/acetonitrile and subsequently sublimed three times under reduced pressure (T=310° C., p=5×10$^{-5}$ mbar), giving 23.6 g (31 mmol) (corresponding to 61.4% of theory) of the product having a purity of greater than 99.5% according to HPLC.

Example 5

Tris[((4-boronic acid pinacol ester)phenylvinyl)phenyl]amine (dopant D5)

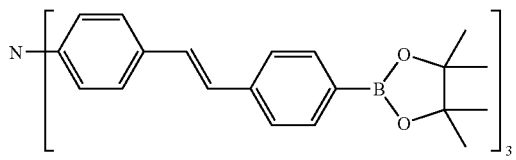

100 ml (250 mmol) of n-BuLi (2.5M in n-hexane) are added dropwise at room temperature to a vigorously stirred suspension of 39.4 g (50 mmol) of tris(4-bromophenylvinylphenyl)amine (from Example 4a) in 1000 ml of diethyl ether, and the mixture is stirred at room temperature for a further 3 h. The solution obtained in this way is cooled to −78° C., a mixture of 50.2 ml (450 mmol) of trimethyl borate in 100 ml of diethyl ether is added, and the mixture is slowly warmed to room temperature. After addition of a mixture of 40 ml of acetic acid and 500 ml of water and stirring for a further 30 min., the organic phase is separated off and evaporated. The yellow solid obtained in this way is suspended in 500 ml of toluene, 17.7 g (150 mmol) of pinacol are added, and the mixture is boiled until the separation of water is complete. The oil obtained after removal of the toluene is recrystallised five times from toluene/acetonitrile and subsequently sublimed three times under reduced pressure (T=290° C., p=5×

10⁻⁵ mbar), giving 25.1 g (27 mmol) (corresponding to 54.0% of theory) of the product having a purity of greater than 99.0% according to HPLC.

Example 6

Tris[((4-trifluoromethoxy)phenylvinyl)phenyl]amine (dopant D6)

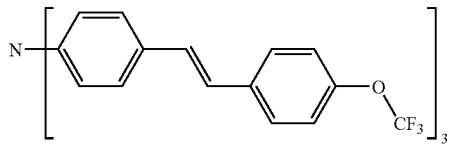

A mixture of 24.1 g (50 mmol) of tris(4-bromophenyl)amine, 30.2 g (225 mmol) of 4-trifluoromethoxystyrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 24 h. After cooling, 500 ml of dichloromethane and 1000 ml of water are added. The organic phase is separated off and washed five times with 500 ml of water. After drying over sodium sulfate, the organic phase is evaporated to dryness. The yellow solid obtained in this way is recrystallised five times from toluene/n-heptane (1:1, v:v), then washed twice by stirring with 500 ml of ethanol under reflux and subsequently sublimed three times under reduced pressure (T=280° C., p=5×10⁻⁵ mbar), giving 11.0 g (17 mmol) (corresponding to 34.3% of theory) of the product having a purity of greater than 99.5% according to HPLC.

Example 7

Tris[4-(6-ethenyl-1,2,3,4-tetrahydro-1,1,4,4-tetramethylnaphthalene)phenyl]amine (dopant D7)

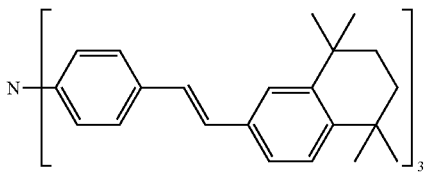

A mixture of 24.1 g (50 mmol) of tris(4-bromophenyl)amine, 48.2 g (225 mmol) of 6-ethenyl-1,2,3,4-tetrahydro-1,1,4,4-tetramethylnaphthalene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water. After drying over sodium sulfate, the organic phase is evaporated to dryness. The yellow solid obtained in this way is recrystallised five times from dioxane, then washed twice by stirring with 500 ml of ethanol under reflux and subsequently sublimed three times under reduced pressure (T=340° C., p=5×10⁻⁵ mbar), giving 24.7 g (28 mmol) (corresponding to 56.0% of theory) of the product having a purity of greater than 99.5% according to HPLC.

Example 8

Tris[4-(fluorophenylvinyl)phenyl]amine (dopant D8)

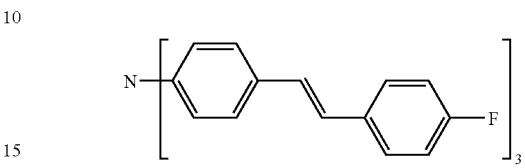

A mixture of 24.1 g (50 mmol) of tris(4-bromophenyl)amine, 26.8 ml (225 mmol) of 4-fluorostyrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water. After drying over sodium sulfate, the organic phase is evaporated to dryness. The yellow solid obtained in this way is recrystallised five times from dioxane, then washed twice by stirring with 500 ml of ethanol under reflux and subsequently sublimed three times under reduced pressure (T=290° C., p=5×10⁻⁵ mbar), giving 15.4 g (26 mmol) (corresponding to 56.1% of theory) of the product having a purity of greater than 99.5% according to HPLC.

Example 9

Production of OLEDs

OLEDs are produced by a general process as described in WO 04/058911, which is adapted in the individual case to the respective circumstances (for example layer-thickness variation in order to achieve optimum efficiency or colour). The basic structure and the materials used (apart from the emitting layer) are identical in the examples for better comparability. OLEDs having the following structure are produced analogously to the above-mentioned general process:

| | |
|---|---|
| Hole-injection layer (HIL) | 20 nm PEDOT (spin-coated from water; purchased from H. C. Starck, Goslar, Germany; poly(3,4-ethylenedioxy-2,5-thiophene)) |
| Hole-transport layer (HTL) | 10 nm 2,2',7,7'-tetrakis(di-para-tolylamino)-spiro-9,9'-bifluorene (abbreviated to HTM-1) |
| Hole-transport layer (HTL) | 30 nm NPB (N-naphthyl-N-phenyl-4,4'-diaminobiphenyl) |
| Emission layer (EML) | see Table 1 for materials, concentration and layer thickness |
| Electron conductor (ETL) | 20 nm AlQ₃ (purchased from SynTec, tris(quinolinato)aluminium(III)) |
| Cathode | 1 nm LiF, 150 nm Al on top |

These OLEDs are characterised by standard methods; for this purpose, the electroluminescence spectra, the efficiency (measured in cd/A), the power efficiency (measured in lm/W) as a function of the brightness, calculated from current/voltage/brightness characteristic lines (IUL characteristic lines), and the lifetime are determined. The lifetime is defined as the time after which the initial brightness of 1000 cd/m² has dropped to half.

Table 1 shows the results for some OLEDs (Examples 10 to 22) which comprise dopants D1 to D8 (examples according to the invention) and dopant C1 (comparative example), where the composition of the EML, including the layer thicknesses, is also given in each case. The structure of dopant C1 is depicted below:

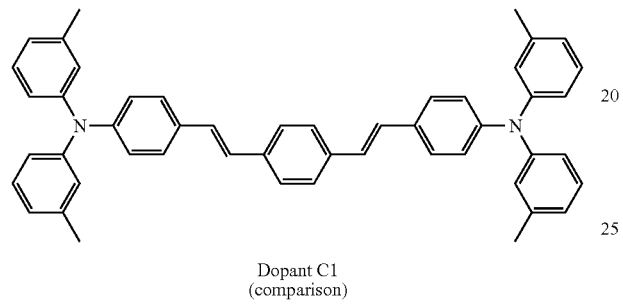

Dopant C1
(comparison)

9,10-Bis(1-naphthyl)anthracene (H1) or 9,10-bis(2-spiro-bifluorenyl)anthracene (H2) is employed as the host material according to the invention. Host material H3 is employed as the comparative host material. The host materials are depicted below:

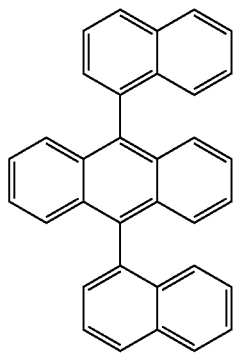

Host H1

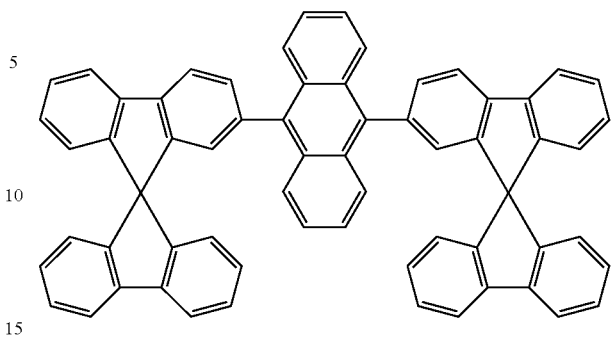

Host H2

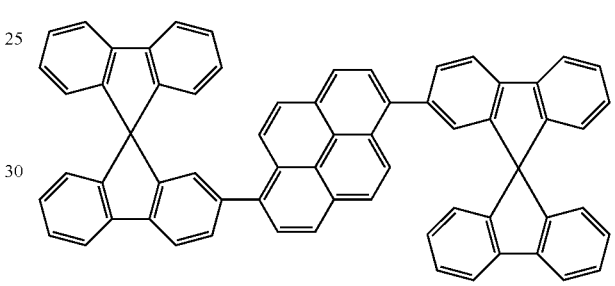

Host H3

For these OLEDs, the degree of doping, i.e. the proportion of dopant in the host material, is in each case optimised in such a way that the best results with respect to colour and lifetime are obtained. With D1 and D2, the best results are obtained with a degree of doping of 2%. With D3 to D8 and C1, the best results are obtained with a degree of doping of 5%.

As can be seen from the examples in Table 1, the electroluminescent devices according to the invention exhibit dark-blue emission with better colour coordinates and improved efficiency at the same time as a significantly improved lifetime compared with the tristilbenamine derivatives in accordance with the prior art. Although dopant C1 in accordance with the prior art also exhibits good lifetimes, the green-blue emission colour means that this dopant cannot, however, be used in high-quality products. In particular, it should furthermore be noted that the lifetimes indicated in the examples were measured at the same initial brightness. If the lifetimes are compared at the same current density and converted to comparable colour coordinates, the electroluminescent devices according to the invention have longer lifetimes than the devices in accordance with the prior art.

TABLE 1

| Example | HTL1 | HTL2 | EML | Max. efficiency (cd/A) | Voltage (V) at 100 cd/m² | CIE | Lifetime (h) |
|---|---|---|---|---|---|---|---|
| Example 10 | HTM-1 (10 nm) | NPB (30 nm) | H1:D1 (2%) (30 nm) | 3.4 | 5.1 | x = 0.15; y = 0.16 | 500 |

TABLE 1-continued

| Example | HTL1 | HTL2 | EML | Max. efficiency (cd/A) | Voltage (V) at 100 cd/m² | CIE | Lifetime (h) |
|---|---|---|---|---|---|---|---|
| Example 11 | HTM-1 (10 nm) | NPB (30 nm) | H1:D2 (2%) (30 nm) | 3.6 | 5.0 | x = 0.15; y = 0.17 | 800 |
| Example 12 | HTM-1 (10 nm) | NPB (20 nm) | H1:D3 (5%) (30 nm) | 4.2 | 5.1 | x = 0.15; y = 0.11 | 1600 |
| Example 13 | HTM-1 (10 nm) | NPB (30 nm) | H1:D4 (5%) (30 nm) | 4.9 | 4.5 | x = 0.15; y = 0.13 | 1200 |
| Example 14 | HTM-1 (10 nm) | NPB (30 nm) | H1:D5 (5%) (30 nm) | 4.7 | 4.7 | x = 0.15; y = 0.14 | 1100 |
| Example 15 | HTM-1 (10 nm) | NPB (30 nm) | H1:D6 (5%) (30 nm) | 4.5 | 4.9 | x = 0.15; y = 0.13 | 1000 |
| Example 16 | HTM-1 (10 nm) | NPB (20 nm) | H1:D7 (5%) (30 nm) | 4.4 | 5.0 | x = 0.15; y = 0.12 | 1500 |
| Example 17 | HTM-1 (10 nm) | NPB (30 nm) | H1:D8 (5%) (30 nm) | 4.0 | 5.2 | x = 0.15; y = 0.14 | 1050 |
| Example 18 (comparison) | HTM-1 (10 nm) | NPB (30 nm) | H1:C1 (5%) (30 nm) | 12.2 | 5.3 | x = 0.17; y = 0.33 | 7000 |
| Example 19 | HTM-1 (10 nm) | NPB (30 nm) | H2:D1 (2%) (30 nm) | 3.1 | 5.5 | x = 0.15; y = 0.14 | 370 |
| Example 20 | HTM-1 (10 nm) | NPB (30 nm) | H2:D2 (2%) (30 nm) | 3.3 | 5.4 | x = 0.15; y = 0.16 | 500 |
| Example 21 | HTM-1 (10 nm) | NPB (30 nm) | H2:D3 (5%) (30 nm) | 3.6 | 5.6 | x = 0.15; y = 0.11 | 650 |
| Example 22 (comparison) | HTM-1 (10 nm) | NPB (30 nm) | H3:D1 (2%) (30 nm) | 3.0 | 5.7 | x = 0.16; y = 0.17 | 280 |

The invention claimed is:

1. An organic electroluminescent device comprising an anode, a cathode and at least one organic layer, wherein said at least one organic layer comprises:

at least one compound of formula (1)

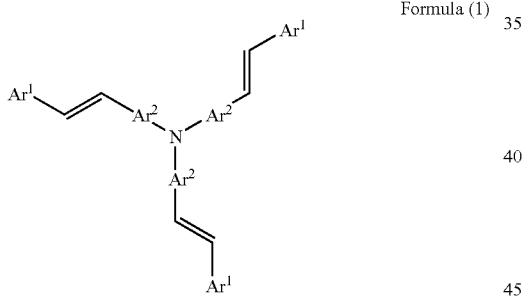

Formula (1)

wherein $Ar^1$ is, identically or differently on each occurrence, an aromatic or heteroaromatic ring system having 5 to 30 aromatic ring atoms optionally substituted by one or more radicals $R^1$;

$Ar^2$ is, identically or differently on each occurrence, a divalent arylene or heteroarylene group having 5 to 20 aromatic ring atoms optionally substituted by one or more radicals $R^1$;

$R^1$ is, identically or differently on each occurrence, H; F; Cl; Br; I; CN; $Si(R^3)_3$; $B(OR^3)_2$; a straight-chain alkyl, alkoxy, or thioalkoxy group having up to 40 C atoms optionally substituted by one or more radicals $R^3$, wherein one or more non-adjacent $CH_2$ groups is optionally replaced by $—R^3C=CR^3—$, $—C≡C—$, $Si(R^3)_2$, $Ge(R^3)_2$, $Sn(R^3)_2$, $C=O$, $C=S$, $C=Se$, $C=NR^3$, $—O—$, $—S—$, $—N(R^3)—$, or $—CONR^3—$, and wherein one or more H atoms is optionally replaced by F, Cl, Br, I, CN, or $NO_2$; a branched or cyclic alkyl, alkoxy, or thioalkoxy group having 3 to 40 C atoms, optionally substituted by one or more radicals $R^3$, wherein one or more non-adjacent $CH_2$ groups is optionally replaced by $—R^3C=CR^3—$, $—C≡C—$, $Si(R^3)_2$, $Ge(R^3)_2$, $Sn(R^3)_2$, $C=O$, $C=S$, $C=Se$, $C=NR^3$, $—O—$, $—S—$, $—N(R^3)—$, or $—CONR^3—$, and wherein one or more H atoms is optionally replaced by F, Cl, Br, I, CN, or $NO_2$; an aryl or heteroaryl group having 5 to 30 aromatic ring atoms optionally substituted by one or more radicals $R^3$, or an aryloxy or heteroaryloxy group having 5 to 24 aromatic ring atoms optionally substituted by one or more radicals $R^3$; or a combination of two, three, four or five of these systems; and wherein two or more substituents $R^1$ optionally define a mono- or polycyclic, aliphatic or aromatic ring system with one another;

$R^3$ is, identically or differently on each occurrence, H or an aliphatic or aromatic hydrocarbon radical having up to 20 C atoms; wherein two or more radicals $R^3$ optionally define a mono- or polycyclic, aliphatic or aromatic ring system with one another; and at least one compound of formula (2) or formula (3)

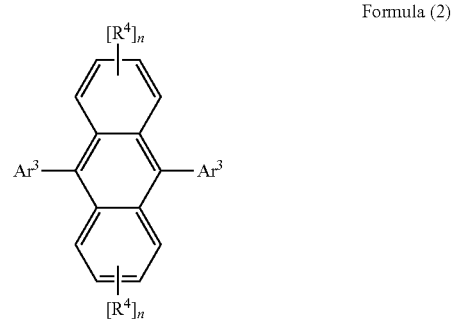

Formula (2)

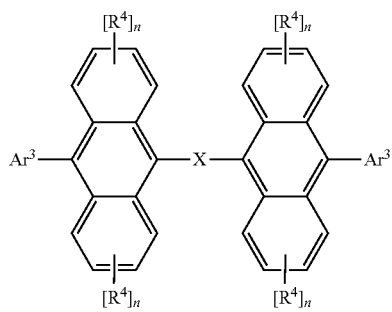

Formula (3)

wherein
Ar³ is, identically or differently on each occurrence, an aromatic or heteroaromatic ring system having 5 to 30 aromatic ring atoms optionally substituted by one or more radicals R²;

X is, identically or differently on each occurrence, a divalent group containing up to 40 C atoms, —O—, —S—, —NH—, or a single bond;

R² and R⁴
are, identically or differently on each occurrence, H; F; Cl; Br; I; CN; N(R³)₂; a straight-chain alkyl, alkoxy, or thioalkoxy group having up to 40 C atoms, optionally substituted by one or more radicals R³, wherein one or more non-adjacent CH₂ groups is optionally replaced by —R³C═CR³—, —C≡C—, Si(R³)₂, Ge(R³)₂, Sn(R³)₂, C═O, C═S, C═Se, C═NR³, —O—, —S—, —N(R³)—, or —CONR³— and wherein one or more H atoms is optionally replaced by F, Cl, Br, I, CN, or NO₂; a branched or cyclic alkyl, alkoxy, or thioalkoxy group having 3 to 40 C atoms, optionally substituted by one or more radicals R³, wherein one or more non-adjacent CH₂ groups is optionally replaced by —R³C═CR³—, —C≡C—, Si(R³)₂, Ge(R³)₂, Sn(R³)₂, C═O, C═S, C═Se, C═NR³, —O—, —S—, —N(R³)—, or —CONR³— and wherein one or more H atoms is optionally replaced by F, Cl, Br, I, CN, or NO₂; an aryl or heteroaryl group having 5 to 30 aromatic ring atoms optionally substituted by one or more radicals R³, or an aryloxy or heteroaryloxy group having 5 to 24 aromatic ring atoms optionally substituted by one or more radicals R³; or a combination of two, three, four or five of these systems; and wherein two or more adjacent substituents R⁴ optionally define a mono- or polycyclic, aliphatic ring system with one another;

R³ is, identically or differently on each occurrence, H or an aliphatic or aromatic hydrocarbon radical having up to 20 C atoms; wherein two or more radicals R³ optionally define a mono- or polycyclic, aliphatic or aromatic ring system with one another; and n is, identically or differently on each occurrence, 0, 1, 2, 3, or 4;

wherein said at least one organic layer is an emitting layer;

wherein said at least one compound of formula (1) is present in said emitting layer as a dopant in an amount of from 1.0 to 20.0% by weight; and wherein said at least one compound of formula (2) or formula (3) is present in said emitting layer as a host in an amount of from 80.0 to 99.0% by weight.

2. The organic electroluminescent device of claim 1, wherein said device comprises at least one compound of formula (1a)

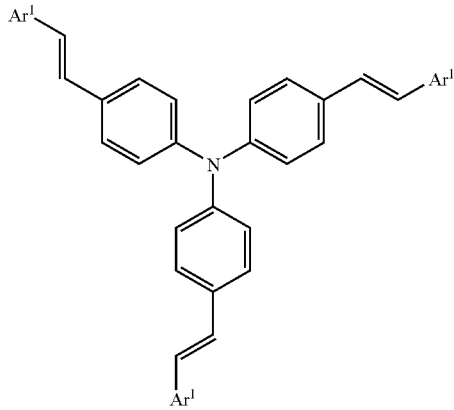

Formula (1a)

wherein the phenylene groups are optionally substituted by one or more radicals R¹.

3. The organic electroluminescent device of claim 1, wherein Ar¹ is, identically or differently on each occurrence, an aryl or heteroaryl group having 6 to 14 C atoms optionally substituted by one or more radicals R¹.

4. The organic electroluminescent device of claim 3, wherein Ar¹ is, identically or differently on each occurrence, an aryl group having 6 to 14 C atoms optionally substituted by one or more radicals R¹.

5. The organic electroluminescent device of claim 1, wherein Ar¹ is a phenyl, 1-naphthyl, or 2-naphthyl group, each of which is optionally substituted by one or more radicals R¹.

6. The organic electroluminescent device of claim 1, wherein R¹ is bonded to Ar¹ in the para-position to the double bond.

7. The organic electroluminescent device of claim 1, wherein R¹ is selected from the group consisting of H; F; Si(R³)₃; B(OR³)₂; straight-chain alkyl or alkoxy groups having up to 6 C atoms, wherein one or more CH₂ groups are optionally replaced by —R³C═CR³—, Si(R³)₂, —O—, —S— or —N(R³)— and wherein one or more H atoms are optionally replaced by F; branched or cyclic alkyl or alkoxy groups having 3 to 10 C atoms, wherein one or more CH₂ groups are optionally replaced by —R³C═CR³—, Si(R³)₂, —O—, —S— or —N(R³)— and wherein one or more H atoms are optionally replaced by F; or aryl or heteroaryl groups having 5 to 14 aromatic ring atoms; or a combination of two or three of these systems.

8. The organic electroluminescent device of claim 1, wherein the compounds of the formula (1) have a threefold axis of symmetry.

9. The organic electroluminescent device of claim 1, wherein Ar³ is, identically or differently on each occurrence, an aromatic or heteroaromatic ring system having 10 to 25 aromatic ring atoms optionally substituted by one or more radicals R².

10. The organic electroluminescent device of claim 1, wherein Ar³ is, identically or differently on each occurrence, a 1-naphthyl, 2-naphthyl, 9-anthryl, 2-phenanthrenyl, 9-phenanthrenyl, quinolinyl, isoquinolinyl, ortho-biphenyl, 2-fluorenyl, or 2-spirobifluorenyl group, each of which is optionally substituted by one or more radicals R².

11. The organic electroluminescent device of claim 1, wherein R² is, identically or differently on each occurrence, H; F; B(OR³)₂; a straight-chain alkyl or alkoxy group having up to 6 C atoms wherein each case one or more $CH_2$ groups are optionally replaced by —$R^3C$=$CR^3$—, $Si(R^3)_2$, —O—, —S— or —$N(R^3)$— and where one or more H atoms are optionally replaced by F; a branched or cyclic alkyl or alkoxy group having 3 to 10 C atoms, wherein each case one or more $CH_2$ groups are optionally replaced by —$R^3C$=$CR^3$—, $Si(R^3)_2$, —O—, —S— or —$N(R^3)$— and where one or more H atoms are optionally replaced by F; or an aryl or heteroaryl group having 5 to 14 aromatic ring atoms; or a combination of two or three of these systems; and wherein two or more adjacent radicals $R^2$ optionally define a mono- or polycyclic, aliphatic or aromatic ring system with one another.

12. The organic electroluminescent device of claim 1, wherein X is, identically or differently on each occurrence, a linear alkylene group having up to 10 C atoms, a branched or cyclic alkylene or alkylidene group having 3 to 10 C atoms, a divalent aromatic group having 6 to 25 C atoms, —O—, —S—, —$N(R^3)$—, —$P(=O)R^3$—, or a single bond.

13. The organic electroluminescent device of claim 1, wherein the compounds of formula (2) and/or formula (3) are pure hydrocarbon compounds.

14. The organic electroluminescent device of claim 1, further comprising at least one optionally doped additional layer selected from the group consisting of hole-injection layers, hole-transport layers, electron-transport layers, electron-injection layers, and combinations thereof, and wherein said organic electroluminescent device optionally comprises a plurality of emitting layers making it capable of emitting white light.

15. A process for producing the organic electroluminescent device of claim 1, wherein at least one compound of formula (1) is applied together with at least one compound of formula (2) and/or formula (3) by a sublimation method or from solution, for example by a printing process.

16. The process of claim 15, wherein at least one compound of formula (1) is applied together with at least one compound of formula (2) and/or formula (3) by a printing process.

17. A mixture comprising at least one compound of formula (1)

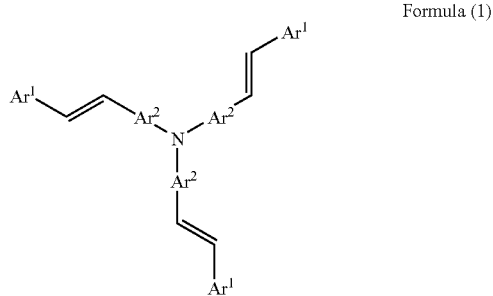

Formula (1)

wherein
$Ar^1$ is, identically or differently on each occurrence, an aromatic or heteroaromatic ring system having 5 to 30 aromatic ring atoms optionally substituted by one or more radicals $R^1$;
$Ar^2$ is, identically or differently on each occurrence, a divalent arylene or heteroarylene group having 5 to 20 aromatic ring atoms optionally substituted by one or more radicals $R^1$;
$R^1$ is, identically or differently on each occurrence, H; F; Cl; Br; I; CN; $Si(R^3)_3$; $B(OR^3)_2$; a straight-chain alkyl, alkoxy, or thioalkoxy group having up to 40 C atoms optionally substituted by one or more radicals $R^3$, wherein one or more non-adjacent $CH_2$ groups is optionally replaced by —$R^3C$=$CR^3$—, —C≡C—, $Si(R^3)_2$, $Ge(R^3)_2$, $Sn(R^3)_2$, C=O, C=S, C=Se, C=$NR^3$, —O—, —S—, —$N(R^3)$—, or —$CONR^3$—, and wherein one or more H atoms is optionally replaced by F, Cl, Br, I, CN, or $NO_2$; a branched or cyclic alkyl, alkoxy, or thioalkoxy group having 3 to 40 C atoms, optionally substituted by one or more radicals $R^3$, wherein one or more non-adjacent $CH_2$ groups is optionally replaced by —$R^3C$=$CR^3$—, —C≡C—, $Si(R^3)_2$, $Ge(R^3)_2$, $Sn(R^3)_2$, C=O, C=S, C=Se, C=$NR^3$, —O—, —S—, —$N(R^3)$—, or —$CONR^3$—, and wherein one or more H atoms is optionally replaced by F, Cl, Br, I, CN, or $NO_2$; an aryl or heteroaryl group having 5 to 30 aromatic ring atoms optionally substituted by one or more radicals $R^3$, or an aryloxy or heteroaryloxy group having 5 to 24 aromatic ring atoms optionally substituted by one or more radicals $R^3$; or a combination of two, three, four or five of these systems; and wherein two or more substituents $R^1$ optionally define a mono- or polycyclic, aliphatic or aromatic ring system with one another;
$R^3$ is, identically or differently on each occurrence, H or an aliphatic or aromatic hydrocarbon radical having up to 20 C atoms; wherein two or more radicals $R^3$ optionally define a mono- or polycyclic, aliphatic or aromatic ring system with one another; and
at least one compound of formula (3)

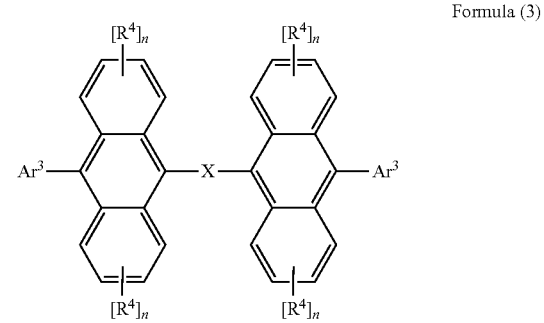

Formula (3)

wherein
$Ar^3$ is, identically or differently on each occurrence, an aromatic or heteroaromatic ring system having 5 to 30 aromatic ring atoms optionally substituted by one or more radicals $R^2$;
X is, identically or differently on each occurrence, a divalent group containing up to 40 C atoms, —O—, —S—, —NH—, or a single bond;
$R^2$ and $R^4$ are, identically or differently on each occurrence, H; F; Cl; Br; I; CN; $N(R^3)_2$; a straight-chain alkyl, alkoxy, or thioalkoxy group having up to 40 C atoms, optionally substituted by one or more radicals $R^3$, wherein one or more non-adjacent $CH_2$ groups is optionally replaced by —$R^3C$=$CR^3$—, $Si(R^3)_2$, $Ge(R^3)_2$, $Sn(R^3)_2$, C=O, C=S, C=Se, C=$NR^3$, —O—, —S—, —$N(R^3)$—, or —$CONR^3$— and wherein one or more H atoms is optionally replaced by F, Cl, Br, I, CN, or $NO_2$; a branched or cyclic alkyl, alkoxy, or thioalkoxy group having 3 to 40 C atoms, optionally substituted by one or more radicals $R^3$, wherein one or more non-adjacent $CH_2$ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³— and wherein one or more H atoms is optionally replaced by F, Cl, Br, I, CN, or NO₂; an aryl or heteroaryl group having 5 to 30 aromatic ring atoms optionally substituted by one or more radicals R³, or an aryloxy or heteroaryloxy group having 5 to 24 aromatic ring atoms optionally substituted by one or more radicals R³; or a combination of two, three, four or five of these systems; and wherein two or more adjacent substituents R⁴ optionally define a mono- or polycyclic, aliphatic ring system with one another;

R³ is, identically or differently on each occurrence, H or an aliphatic or aromatic hydrocarbon radical having up to 20 C atoms; wherein two or more radicals R³ optionally define a mono- or polycyclic, aliphatic or aromatic ring system with one another; and n is, identically or differently on each occurrence, 0, 1, 2, 3, or 4;

wherein said at least one compound of formula (1) is present in said mixture as a dopant in an amount of from 1.0 to 20.0% by weight; and wherein said at least one compound of formula (2) or formula (3) is present in said mixture as a host in an amount of from 80.0 to 99.0% by weight.

18. An organic electroluminescent device comprising an emitting layer comprising a mixture comprising at least one compound of formula (1)

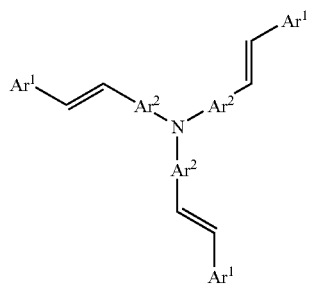

Formula (1)

wherein

Ar¹ is, identically or differently on each occurrence, an aromatic or heteroaromatic ring system having 5 to 30 aromatic ring atoms optionally substituted by one or more radicals R¹;

Ar² is, identically or differently on each occurrence, a divalent arylene or heteroarylene group having 5 to 20 aromatic ring atoms optionally substituted by one or more radicals R¹;

R¹ is, identically or differently on each occurrence, H; F; Cl; Br; I; CN; Si(R³)₃; B(OR³)₂; a straight-chain alkyl, alkoxy, or thioalkoxy group having up to 40 C atoms optionally substituted by one or more radicals R³, wherein one or more non-adjacent CH₂ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³—, and wherein one or more H atoms is optionally replaced by F, Cl, Br, I, CN, or NO₂; a branched or cyclic alkyl, alkoxy, or thioalkoxy group having 3 to 40 C atoms, optionally substituted by one or more radicals R³, wherein one or more non-adjacent CH₂ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³—, and wherein one or more H atoms is optionally replaced by F, Cl, Br, I, CN, or NO₂; an aryl or heteroaryl group having 5 to 30 aromatic ring atoms optionally substituted by one or more radicals R³, or an aryloxy or heteroaryloxy group having 5 to 24 aromatic ring atoms optionally substituted by one or more radicals R³; or a combination of two, three, four or five of these systems; and wherein two or more substituents R¹ optionally define a mono- or polycyclic, aliphatic or aromatic ring system with one another;

R³ is, identically or differently on each occurrence, H or an aliphatic or aromatic hydrocarbon radical having up to 20 C atoms; wherein two or more radicals R³ optionally define a mono- or polycyclic, aliphatic or aromatic ring system with one another; and at least one compound of formula (2) or formula (3)

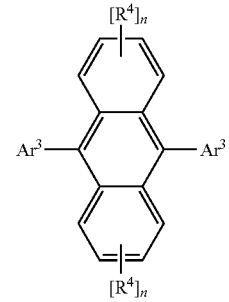

Formula (2)

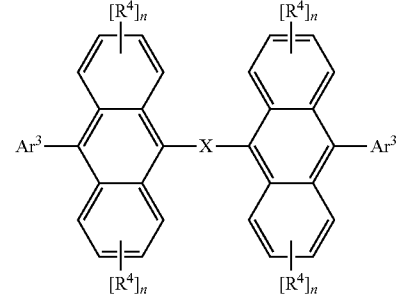

Formula (3)

wherein

Ar³ is, identically or differently on each occurrence, an aromatic or heteroaromatic ring system having 5 to 30 aromatic ring atoms optionally substituted by one or more radicals R²;

X is, identically or differently on each occurrence, a divalent group containing up to 40 C atoms, —O—, —S—, —NH—, or a single bond;

R² and R⁴ are, identically or differently on each occurrence, H; F; Cl; Br; I; CN; N(R³)₂; a straight-chain alkyl, alkoxy, or thioalkoxy group having up to 40 C atoms, optionally substituted by one or more radicals R³, wherein one or more non-adjacent CH₂ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³— and wherein one or more H atoms is optionally replaced by F, Cl, Br, I, CN, or NO₂; a branched or cyclic alkyl, alkoxy, or thioalkoxy group having 3 to 40 C atoms, optionally substituted by one or more radicals R³, wherein one or more non-adjacent CH₂ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³— and wherein one or more H atoms is optionally replaced by F, Cl, Br, I, CN, or NO₂; an aryl or heteroaryl group having 5 to 30 aromatic ring atoms optionally substituted by one or more radicals R³, or an aryloxy or heteroaryloxy group having 5 to 24 aromatic ring atoms optionally substituted by one or more radicals R³; or a combination of two, three, four or five of these systems; and wherein two or more adjacent substituents R⁴ optionally define a mono- or polycyclic, aliphatic ring system with one another;

R³ is, identically or differently on each occurrence, H or an aliphatic or aromatic hydrocarbon radical having up to 20 C atoms; wherein two or more radicals R³ optionally define a mono- or polycyclic, aliphatic or aromatic ring system with one another; and n is, identically or differently on each occurrence, 0, 1, 2, 3, or 4;

wherein said at least one compound of formula (1) is present in said mixture as a dopant in an amount of from 1.0 to 20.0% by weight; and wherein said at least one compound of formula (2) or formula (3) is present in said mixture as a host in an amount of from 80.0 to 99.0% by weight.

19. An organic field-effect transistor, an organic thin-film transistor, an organic light-emitting transistor, an organic integrated circuit, an organic solar cell, an organic field-quench device, an organic photoreceptor, or an organic laser diode comprising an emitting layer comprising a mixture comprising at least one compound of formula (1)

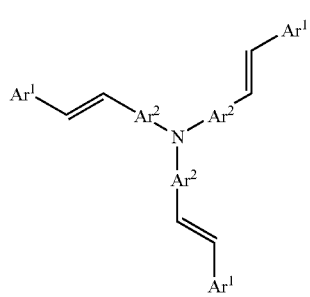

Formula (1)

wherein

Ar¹ is, identically or differently on each occurrence, an aromatic or heteroaromatic ring system having 5 to 30 aromatic ring atoms optionally substituted by one or more radicals R¹;

Ar² is, identically or differently on each occurrence, a divalent arylene or heteroarylene group having 5 to 20 aromatic ring atoms optionally substituted by one or more radicals R¹;

R¹ is, identically or differently on each occurrence, H; F; Cl; Br; I; CN; Si(R³)₃; B(OR³)₂; a straight-chain alkyl, alkoxy, or thioalkoxy group having up to 40 C atoms optionally substituted by one or more radicals R³, wherein one or more non-adjacent CH₂ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³— and wherein one or more H atoms is optionally replaced by F, Cl, Br, I, CN, or NO₂; a branched or cyclic alkyl, alkoxy, or thioalkoxy group having 3 to 40 C atoms, optionally substituted by one or more radicals R³, wherein one or more non-adjacent CH₂ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³—, and wherein one or more H atoms is optionally replaced by F, Cl, Br, I, CN, or NO₂; an aryl or heteroaryl group having 5 to 30 aromatic ring atoms optionally substituted by one or more radicals R³, or an aryloxy or heteroaryloxy group having 5 to 24 aromatic ring atoms optionally substituted by one or more radicals R³; or a combination of two, three, four or five of these systems; and wherein two or more substituents R¹ optionally define a mono- or polycyclic, aliphatic or aromatic ring system with one another;

R³ is, identically or differently on each occurrence, H or an aliphatic or aromatic hydrocarbon radical having up to 20 C atoms; wherein two or more radicals R³ optionally define a mono- or polycyclic, aliphatic or aromatic ring system with one another; and at least one compound of formula (2) or formula (3)

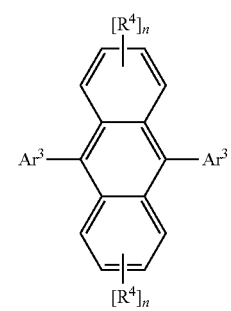

Formula (2)

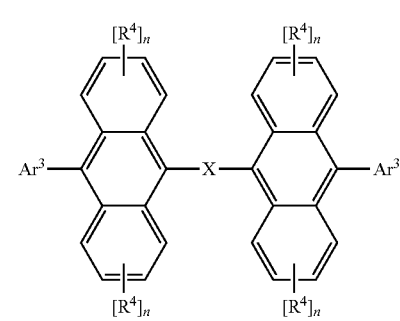

Formula (3)

wherein

Ar³ is, identically or differently on each occurrence, an aromatic or heteroaromatic ring system having 5 to 30 aromatic ring atoms optionally substituted by one or more radicals R²;

X is, identically or differently on each occurrence, a divalent group containing up to 40 C atoms, —O—, —S—, —NH—, or a single bond;

R² and R⁴ are, identically or differently on each occurrence, H; F; Cl; Br; I; CN; N(R³)₂; a straight-chain alkyl, alkoxy, or thioalkoxy group having up to 40 C atoms, optionally substituted by one or more radicals R³, wherein one or more non-adjacent CH₂ groups is optionally replaced by —R³C=CR³—, —C≡C—, Si(R³)₂, Ge(R³)₂, Sn(R³)₂, C=O, C=S, C=Se, C=NR³, —O—, —S—, —N(R³)—, or —CONR³— and wherein one or more H atoms is optionally replaced by F, Cl, Br, I, CN, or NO₂; a branched or cyclic alkyl, alkoxy, or thioalkoxy group having 3 to 40 C atoms, optionally substituted by one or more radicals $R^3$, wherein one or more non-adjacent $CH_2$ groups is optionally replaced by $-R^3C=CR^3-$, $-C\equiv C-$, $Si(R^3)_2$, $Ge(R^3)_2$, $Sn(R^3)_2$, $C=O$, $C=S$, $C=Se$, $C=NR^3$, $-O-$, $-S-$, $-N(R^3)-$, or $-CONR^3-$ and wherein one or more H atoms is optionally replaced by F, Cl, Br, I, CN, or $NO_2$; an aryl or heteroaryl group having 5 to 30 aromatic ring atoms optionally substituted by one or more radicals $R^3$, or an aryloxy or heteroaryloxy group having 5 to 24 aromatic ring atoms optionally substituted by one or more radicals $R^3$; or a combination of two, three, four or five of these systems; and wherein two or more adjacent substituents $R^4$ optionally define a mono- or polycyclic, aliphatic ring system with one another;

$R^3$ is, identically or differently on each occurrence, H or an aliphatic or aromatic hydrocarbon radical having up to 20 C atoms; wherein two or more radicals $R^3$ optionally define a mono- or polycyclic, aliphatic or aromatic ring system with one another; and n is, identically or differently on each occurrence, 0, 1, 2, 3, or 4;

wherein said at least one compound of formula (1) is present in said mixture as a dopant in an amount of from 1.0 to 20.0% by weight; and wherein said at least one compound of formula (2) or formula (3) is present in said mixture as a host in an amount of from 80.0 to 99.0% by weight.

20. The organic electroluminescent device of claim 1, wherein said at least one compound of formula (1) is present in said mixture as a dopant in an amount of from 1.0 to 10.0% by weight; and wherein said at least one compound of formula (2) or formula (3) is present in said mixture as a host in an amount of from 90.0 to 99.0% by weight.

21. The organic electroluminescent device of claim 18, wherein said at least one compound of formula (1) is present in said mixture as a dopant in an amount of from 1.0 to 10.0% by weight; and wherein said at least one compound of formula (2) or formula (3) is present in said mixture as a host in an amount of from 90.0 to 99.0% by weight.

22. The organic electroluminescent device of claim 1, wherein said at least one compound of formula (1) is present in said mixture as a dopant in an amount of from 2.0 to 5.0% by weight; and wherein said at least one compound of formula (2) or formula (3) is present in said mixture as a host in an amount of from 95.0 to 98.0% by weight.

23. The organic electroluminescent device of claim 1, wherein said at least one compound of formula (1) is present in said mixture as a dopant in an amount of from 2.0 to 5.0% by weight; and wherein said at least one compound of formula (2) or formula (3) is present in said mixture as a host in an amount of from 95.0 to 98.0% by weight.

* * * * *